(12) United States Patent
Ohta et al.

(10) Patent No.: US 8,427,144 B2
(45) Date of Patent: Apr. 23, 2013

(54) MAGNETIC SENSOR THAT INCLUDES MAGENETORESISTIVE FILMS AND CONDUCTORS THAT COMBINE THE MAGNETORESISTIVE FILMS

(75) Inventors: Naoki Ohta, Tokyo (JP); Masanori Sakai, Tokyo (JP); Hiraku Hirabayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 352 days.

(21) Appl. No.: 12/844,090

(22) Filed: Jul. 27, 2010

(65) Prior Publication Data

US 2011/0025320 A1 Feb. 3, 2011

(30) Foreign Application Priority Data

Jul. 28, 2009 (JP) ................................. 2009-175670

(51) Int. Cl.
*G01R 33/09* (2006.01)

(52) U.S. Cl.
USPC .......................................................... 324/252

(58) Field of Classification Search ................... 324/252
See application file for complete search history.

(56) References Cited

U.S. PATENT DOCUMENTS

| 4,012,781 A * | 3/1977 | Lin ................................ 360/315 |
| 4,603,365 A * | 7/1986 | Nakamura ....................... 362/55 |
| 5,621,377 A | 4/1997 | Dettmann et al. |
| 2002/0145835 A1 | 10/2002 | Suzuki et al. |
| 2007/0230065 A1 | 10/2007 | Yuasa et al. |
| 2008/0272771 A1 | 11/2008 | Guo et al. |

FOREIGN PATENT DOCUMENTS

| JP | A-11-112054 | 4/1999 |
| JP | A-2001-102659 | 4/2001 |

OTHER PUBLICATIONS

European Search Report in European Patent Application No. 10007856.7; dated Oct. 21, 2010.

* cited by examiner

*Primary Examiner* — Jay Patidar
(74) *Attorney, Agent, or Firm* — Oliff & Berridge, PLC

(57) ABSTRACT

A magnetoresistive element includes magnetoresistive films each having an upper surface and a lower surface, and conductors combining the magnetoresistive films in series and including top electrodes and bottom electrodes. Each one of the top electrodes and corresponding one of the bottom electrodes oppose each other to sandwich corresponding one of the magnetoresistive films. Each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends. The branch section in the top electrode is in contact with an upper surface of the corresponding magnetoresistive film, and the branch section in the bottom electrode is in contact with a lower surface of the corresponding magnetoresistive film.

9 Claims, 17 Drawing Sheets

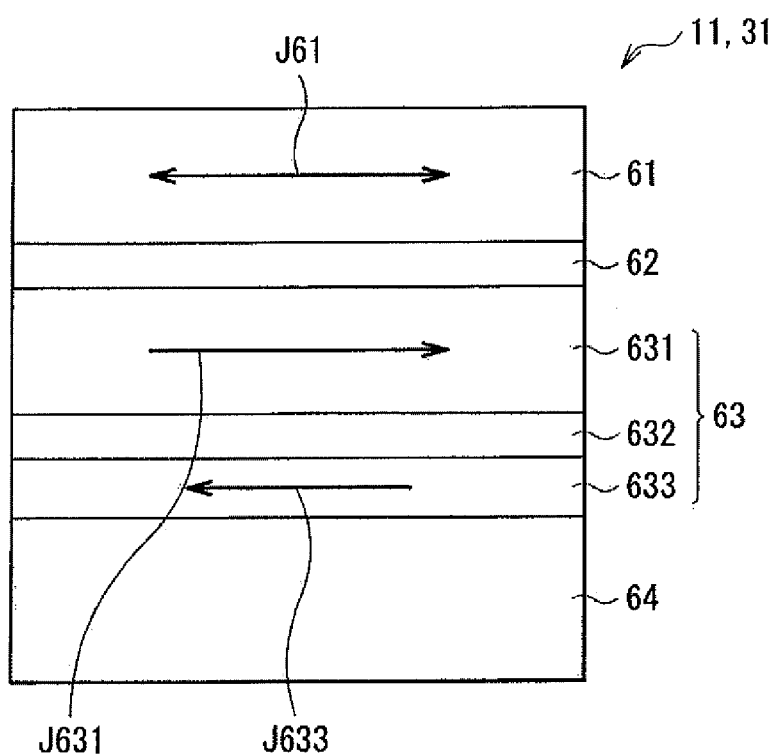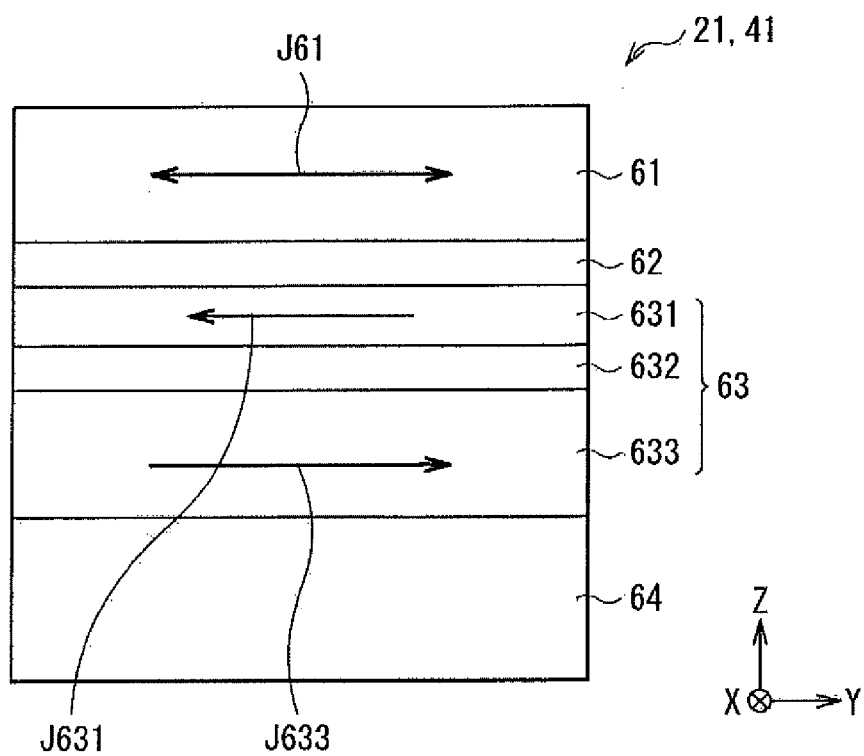

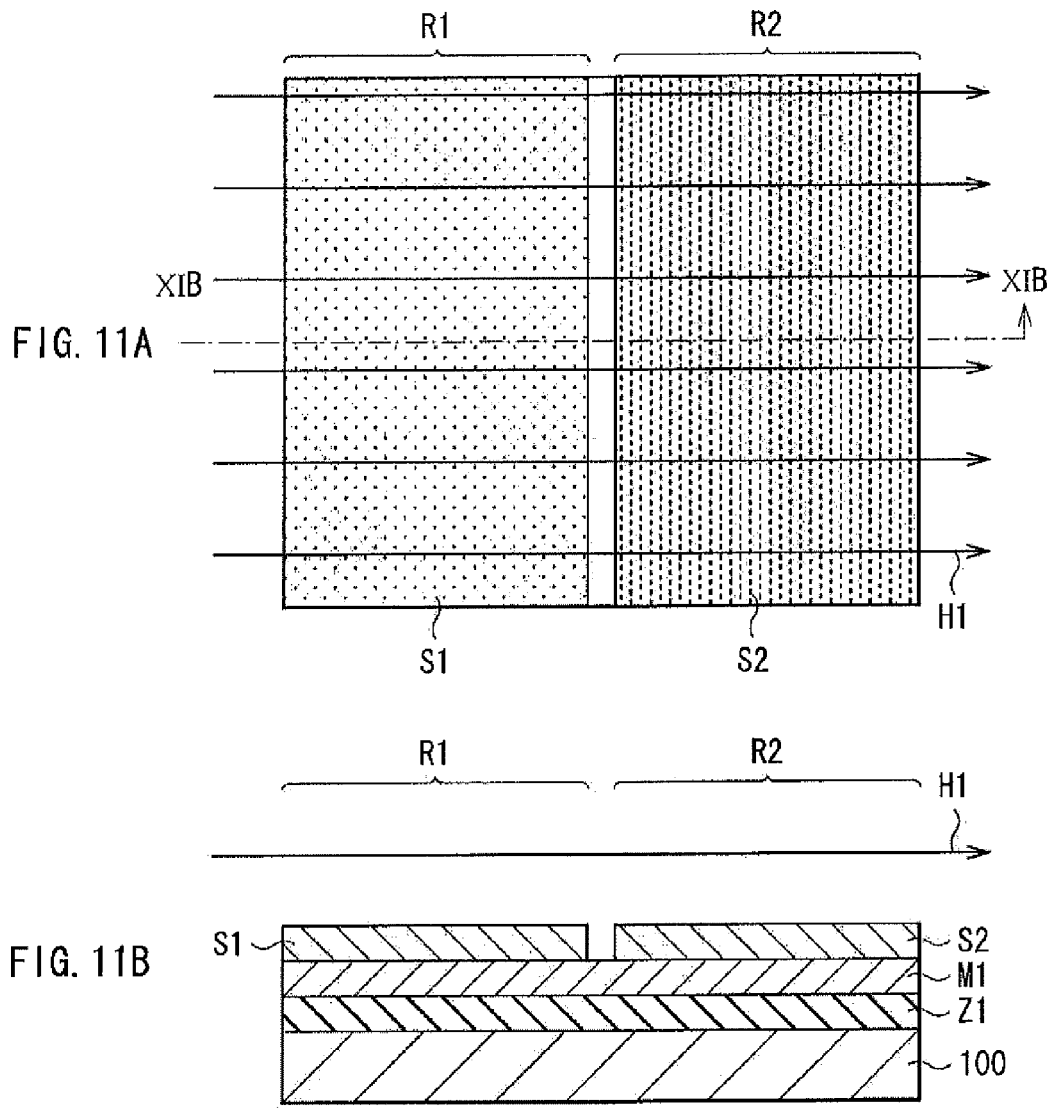

MAGNETIC SENSOR THAT INCLUDES MAGENETORESISTIVE FILMS AND CONDUCTORS THAT COMBINE THE MAGNETORESISTIVE FILMS

BACKGROUND OF THE INVENTION

1. Field of the Invention

The invention relates to a magnetic sensor capable of detecting a change in a magnetic field highly sensitively.

2. Description of the Related Art

In general, when detecting a minute control current flowing in a circuit of a control device accurately, a method is used, where resistors are connected in series in the circuit and a voltage drop of the resistors is measured. However, this may cause some adverse effect on a control system, since a load different from that of the control system is applied. Thus, a method which performs indirect measurement by detecting a gradient of a current magnetic field generated by a control current has been used. For example, the indirect measurement method is achieved by winding a measurement line around a toroidal core, and supplying a control current to the measurement line, to detect a magnetic flux generated in a central part of the toroidal core with a Hall element.

It has been pointed out however, that a current sensor which achieves the method described above has disadvantages, in that a reduction in size is difficult, and that such a current sensor is insufficient in terms of a linearity or a high-frequency response property, and so forth. To address these issues, a magnetic sensor has been proposed, in which a giant magnetoresistive element (which may be hereinafter referred to as a "GMR element") exhibiting a giant magnetoresistive effect is disposed in an induction magnetic field generated by a control current, and a gradient of the induction magnetic field is detected, as disclosed in U.S. Pat. No. 5,621,377, for example. Also, in this connection, a technology which utilizes a magnetic sensor provided with a GMR element to detect a flaw on a surface of a metal surface, for example, is known. The magnetic sensor utilizing the GMR element makes it possible to relatively improve a detection sensitivity and a response property, and to obtain detection characteristics which are stable even in a temperature variation.

Also, a magnetic sensor utilizing a magnetic tunnel junction element (which may be hereinafter referred to as a "MTJ element"), which exhibits a MR ratio higher than that of the GMR element, has been also under development, as disclosed in Japanese Unexamined Patent Application Publication No, H11-112054 and No. 2001-102659, for example.

SUMMARY OF THE INVENTION

The inventor(s) has/have found the following drawback associated with existing techniques. That is, in recent years, there has been a strong desire for a magnetic sensor capable of detecting a change in a weaker magnetic flux and having a more compact overall configuration. However, with further reduction in size, even a magnetic sensor utilizing a GMR element or a MTJ element is more likely to be susceptible to an external noise such as an unnecessary magnetic field, presenting a problem of improvement in stability in terms of a detection sensitivity and a response property. In this regard, some attempts have been made up to now, such as adapting a shape of the GMR element to have an elongated strip to increase a shape anisotropy, although they are yet far from a performance level that is sufficiently stable.

It is therefore desirable to provide a magnetic sensor which is compact and yet capable of detecting a signal magnetic field as a detection target, highly sensitively and stably.

A magnetoresistive element according to an embodiment includes: a plurality of magnetoresistive films each aligned along a lamination plane, and each having an upper surface and a lower surface; and conductors combining the plurality of magnetoresistive films in series, and including a plurality of top electrodes and a plurality of bottom electrodes. Each one of the top electrodes and corresponding one of the bottom electrodes oppose each other so as to sandwich corresponding one of the magnetoresistive films in a direction of stack of the magnetoresistive films, each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends, and the branch section in each of the top electrodes is in contact with an upper surface of the corresponding magnetoresistive film, and the branch section in each of the bottom electrodes is in contact with a lower surface of the corresponding magnetoresistive film.

A magnetic sensor according to an embodiment includes: first and second magnetoresistive elements each exhibiting a resistance change in an increasing/decreasing direction opposite to each other in response to a signal magnetic field, each of the first and second magnetoresistive elements includes: a plurality of magnetoresistive films each aligned along a lamination plane, and each having an upper surface and a lower surface; and conductors combining the plurality of magnetoresistive films in series, and including a plurality of top electrodes and a plurality of bottom electrodes. Each one of the top electrodes and corresponding one of the bottom electrodes oppose each other so as to sandwich corresponding one of the magnetoresistive films in a direction of stack of the magnetoresistive films, each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends, and the branch section in each of the top electrodes is in contact with an upper surface of the corresponding magnetoresistive film, and the branch section in each of the bottom electrodes is in contact with a lower surface of the corresponding magnetoresistive film.

A magnetic sensor according to an embodiment includes: first to fourth magnetoresistive elements each exhibiting a resistance change in response to a signal magnetic field, and having a difference detector, each of the first to fourth magnetoresistive elements includes: a plurality of magnetoresistive films each aligned along a lamination plane, and each having an upper surface and a lower surface; and conductors combining the plurality of magnetoresistive films in series, and including a plurality of top electrodes and a plurality of bottom electrodes. Each one of the top electrodes and corresponding one of the bottom electrodes oppose each other so as to sandwich corresponding one of the magnetoresistive films in a direction of stack of the magnetoresistive films. Each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends. The branch section in each of the top electrodes is in contact with an upper surface of the corresponding magnetoresistive film, and the branch section in each of the bottom electrodes is in contact with a lower surface of the corresponding magnetoresistive film. A first end of the first magnetoresistive element and a first end of the second magnetoresistive element are connected together in a first connection point, a first end of the third magnetoresistive element and a first end of the fourth magnetoresistive element are connected together in a second connection point, a second end of the first magnetoresistive element and a second end of the fourth magnetoresistive element are connected together in a third connection point, and a second end of the second magnetoresistive element and a second end of the third magnetoresistive element are connected together in a fourth connection point, to establish a bridge circuit. Resistances of the first and third magnetoresistive elements change in a same increasing/decreasing direction in response to the signal magnetic field. Resistances of the second and fourth magnetoresistive elements change in an increasing/decreasing direction opposite to the increasing/decreasing direction of the resistances of the first and third magnetoresistive elements in response to the signal magnetic field. The difference detector detects a difference in potential, which is caused between the third and fourth connection points in response to application of a voltage between the first and second connection points.

In the magnetoresistive element and the magnetic sensors according to the embodiments, a read-out current, having entered the top electrode, passes through the magnetoresistive film, and then flows out to the bottom electrode, for example. Here, the branch section of the top electrode, which is in contact with the upper surface of the magnetoresistive film, and the branch section of the bottom electrode, which is in contact with the lower surface of the magnetoresistive film, are positioned to oppose each other in the stack direction (i.e., they are so positioned as to overlap each other when viewed in the stack direction). Thus, a direction of the read-out current flowing in the branch section of the top electrode and that of the read-out current flowing in the branch section of the bottom electrode become opposite to each other. Consequently, an induction magnetic field generated around the branch section of the top electrode and that generated around the branch section of the bottom electrode cancel each other. As used herein, the term "opposite" may not be limited to a complete antiparallel direction (i.e., a state where an angle between the read-out current flowing in the branch section of the top electrode and that flowing in the branch section of the bottom electrode is 180 degrees), and may refer to a state where an angle (or a relative angle) between the read-out current flowing in the branch section of the top electrode and that flowing in the branch section of the bottom electrode is over 90 degrees and is equal to or less than 180 degrees. In this regard, it is most preferable that the direction of the read-out current flowing in the branch section of the top electrode and that of the read-out current flowing in the branch section of the bottom electrode become complete antiparallel to each other, since the induction magnetic field generated around the branch section of the top electrode and that generated around the branch section of the bottom electrode are further reduced. Also, according to the embodiments, since each of the magnetoresistive films is connected with the branch section of the top electrode and with the branch section of the bottom electrode, each of the magnetoresistive films is disposed away from the stem sections. Thus, an influence of the induction magnetic field, generated in the stem sections, on each of the magnetoresistive films is reduced.

Advantageously, the stem section of the top electrode, having the branch section which is connected with one of the magnetoresistive films, is connected to the stem section of the bottom electrode, having the branch section which is connected with another one of the magnetoresistive films adjacent thereto along the series alignment direction. This allows all of the directions of the read-out currents flowing in the respective magnetoresistive films to be aligned in the same direction, making it possible to reduce a variation in behavior in each of the magnetoresistive films in response to the signal magnetic field, and to detect the signal magnetic field further accurately.

Advantageously, the extending direction of the branch section of each of the top electrodes and the extending direction of the branch section of each of the bottom electrodes correspond to a direction orthogonal to the series alignment direction of the magnetoresistive films. This allows a length of the branch section to be the shortest while separating the magnetoresistive film away from the stem section, making it possible to effectively reduce a resistance of the top electrode and the bottom electrode. Also, this allows the branch section of the top electrode and the branch section of the bottom electrode to extend in parallel to each other, making it possible to sufficiently reduce an influence of electromotive force generated by the current flowing in both branch sections.

Advantageously, the branch sections of the top electrodes and the branch sections of the bottom electrodes each have cross-sectional area equal to one another. The cross-sectional area represents an area of a cross-section orthogonal to the direction in which the branch section extends. This makes it possible to sufficiently cancel the induction magnetic field generated around each of the branch sections.

Advantageously, the magnetoresistive films are current-perpendicular-to-plane giant magnetoresistive (CPP-GMR) films, or tunnel magnetoresistive (TMR) films. This makes it possible to achieve a higher MR ratio.

According to the magnetoresistive element and the magnetic sensors of the embodiments, the respective magnetoresistive elements, connected in series to one another, are disposed between the branch sections of the top electrodes and the branch sections of the bottom electrodes, which are opposed to each other in a thickness direction. This makes it possible to allow the direction of the read-out current flowing in the branch sections of the top electrodes and that of the read-out current flowing in the branch sections of the bottom electrodes to be opposite to each other. Thereby, the induction magnetic field generated around the branch sections of the top electrodes and that generated around the branch sections of the bottom electrodes cancel each other. Thus, it is possible to reduce an adverse effect of the unnecessary induction magnetic field caused by the read-out current on the magnetoresistive films. Also, each of the magnetoresistive films is connected with the branch sections. Thus, each of the magnetoresistive films is provided away from the stem sections. Therefore, it is possible to reduce the adverse effect of the induction magnetic field, caused by the read-out current, on each of the magnetoresistive films even when high-integration is achieved, and to detect the signal magnetic field with higher accuracy and stability.

In particular, providing of the branch section of the top electrodes and the branch section of the bottom electrodes each to have the cross-sectional area equal to one another enables to further reduce the unnecessary induction magnetic field reaching the magnetoresistive films, and to further improve the accuracy in the detection of the signal magnetic field.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the specification, serve to explain the principles of the invention.

FIG. 3A and FIG. 3B are cross-sectional views each illustrating a laminated structure of a stacked body included in each of first to fourth MR elements illustrated in FIG. 2.

FIG. 11A and FIG. 11B are a plan view and a cross-sectional view illustrating a process subsequent to that in FIGS. 10A and 10B, respectively.

DETAILED DESCRIPTION OF THE PREFERRED EMBODIMENTS

Hereinafter, some embodiments of the invention will be described in detail with reference to the accompanying drawings.

First Embodiment

Figure 1:
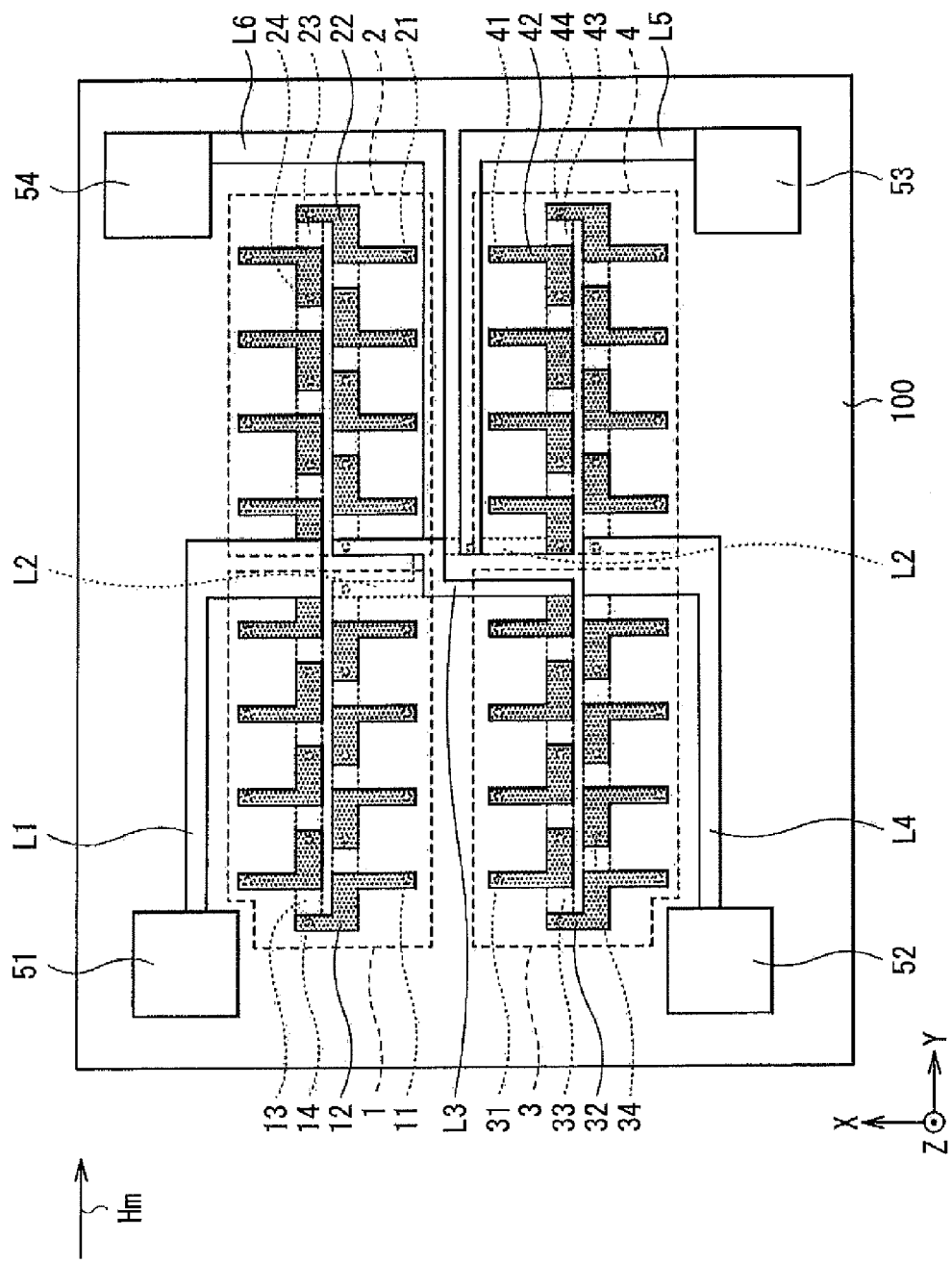
FIG. 1 is a plan view illustrating an overall configuration of a magnetic sensor according to a first embodiment of the invention.
Figure 2:
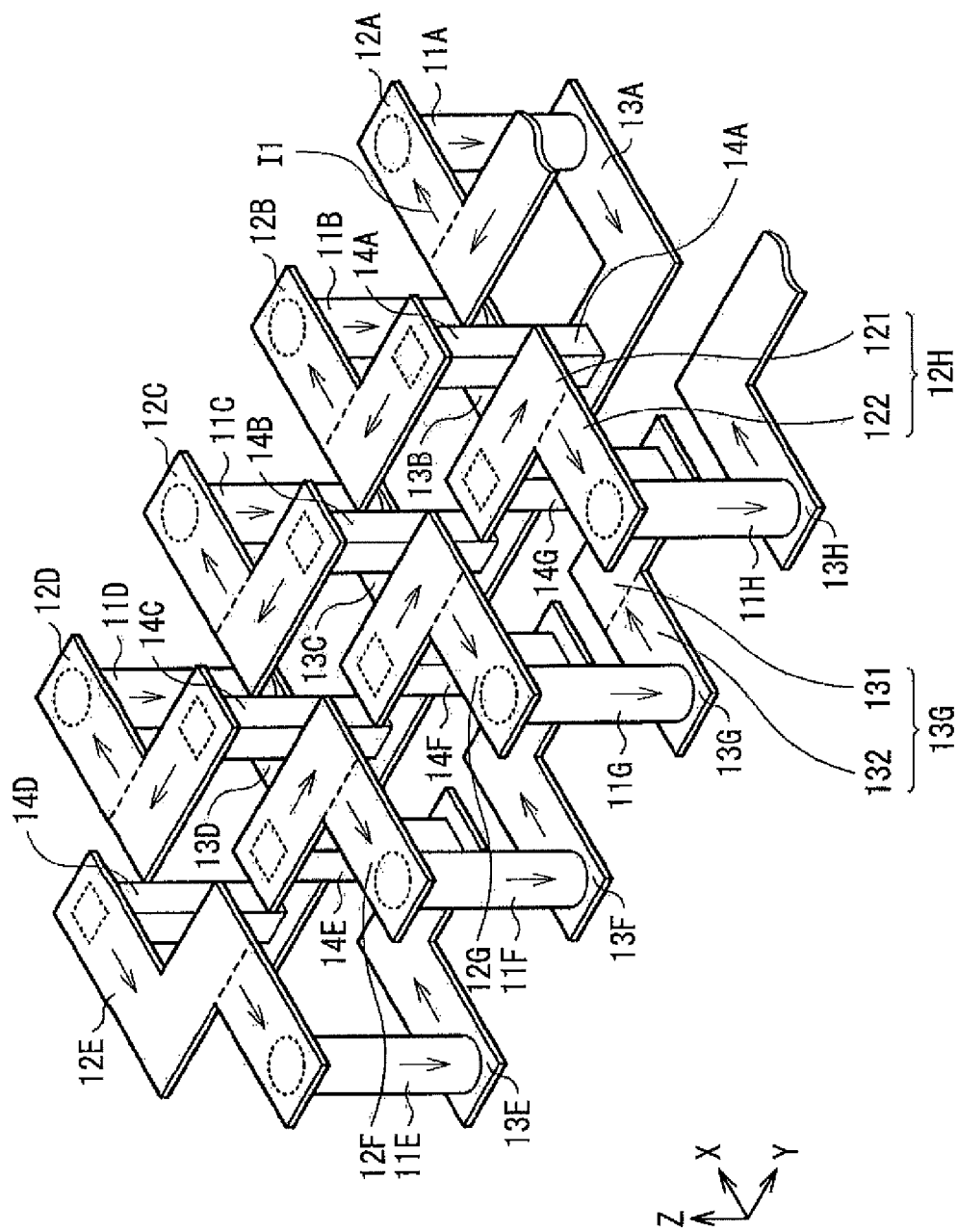
FIG. 2 is an enlarged perspective view illustrating a main configuration of the magnetic sensor illustrated in FIG. 1.

First, a configuration of a magnetic sensor according to a first embodiment of the invention will be described with reference to FIGS. 1 to 16B. FIG. 1 is a plan view illustrating an overall configuration of the magnetic sensor according to the first embodiment. FIG. 2 is an enlarged perspective view illustrating a main configuration of the magnetic sensor.

The magnetic sensor according to this embodiment includes first to fourth magnetoresistive (MR: Magneto-Resistive effect) elements 1 to 4 (hereinafter may be simply referred to as "MR elements"), pads 51 to 54, interconnections L1 to L6, and a difference detector AMP (which will be described later), and so forth, which are provided on a substrate 100. The magnetic sensor detects a direction and a magnitude of a signal magnetic field Hm which changes in a certain plane of rotation (in an XY plane in this embodiment). For example, the pad 51 is connected to a power source Vcc which will be described later, and the pad 52 is grounded. Each of the pads 53 and 54 is connected to an input terminal of the difference detector AMP, for example.

The substrate 100 may be a rectangular member which supports the magnetic sensor as a whole, and may be configured of ceramics. The ceramics of the substrate 100 can be glass, silicon (Si), aluminum oxide ($Al_2O_3$), AlTiC ($Al_2O_3$—TiC), or other suitable material. An insulating layer (not illustrated) containing ceramics such as silicon oxide ($SiO_2$), aluminum oxide, and so forth may be provided to cover the substrate 100.

The first to the fourth MR elements 1 to 4 include a plurality of stacked bodies 11, 21, 31, and 41 each having a spin-valve configuration, respectively. In the exemplary embodiment illustrated in FIGS. 1 and 2, the first to the fourth MR elements 1 to 4 include eight stacked bodies 11, 21, 31, and 41, respectively, although it is not limited thereto. When the signal magnetic field Hm is applied, a resistance of each of the first and the third MR elements 1 and 3 changes in the same direction (i.e., the same increasing/decreasing direction) in response to the signal magnetic field Hm, and a resistance of each of the second and the fourth MR elements 2 and 4 changes in a direction (i.e., an increasing/decreasing direction) opposite to that of the first and the third MR elements 1 and 3 in response to the signal magnetic field Hm. Note that the first to the fourth MR elements 1 to 4 each have a substantially similar configuration to one another, except for a configuration of the stacked bodies 11, 21, 31, and 41. In the following, the description will be made based on the first MR element 1 on behalf of the first to the fourth MR elements 1 to 4 with reference mainly to FIG. 2, except for the description on the stacked bodies 11, 21, 31, and 41.

As illustrated in FIG. 2, the first MR element 1 has a configuration in which the plurality of stacked bodies 11 (stacked bodies 11A to 11H) are mutually connected or combined in series through top electrodes 12 (top electrodes 12A to 12H), bottom electrodes 13 (bottom electrodes 13A to 13H), and columnar connectors 14 (connectors 14A to 14H), for example. The top electrodes 12 and the bottom electrodes 13 include stem sections 121 and 131 extending along an aligning direction of adjacent stacked bodies 11 (i.e., extending in a direction along a series alignment direction of the stacked bodies 11, or extending in a Y-axis direction in FIG. 2), and branch sections 122 and 132 extending along a lamination plane in a direction orthogonal to the extending direction of the stem sections 121 and 131 (i.e., extending in an X-axis direction in FIG. 2), respectively. Each of the branch sections 122 and 132 is disposed to oppose each other so as to sandwich the stacked body 11 in a thickness direction (i.e., in a direction of stack), and is in contact with an upper surface and a lower surface of the stacked body 11. The stem section 121 of the top electrode 12, having the branch section 122 which is connected with one of the stacked bodies 11, is connected via the connector 14 to the stem section 131 of the bottom electrode 13, having the branch section 132 which is connected with adjacent another one of the stacked bodies 11. For example, the stem section 121 of the top electrode 12H, whose branch section 122 is connected with the stacked body 11H, is connected via the connector 14G to the stem section 131 of the bottom electrode 13G, whose branch section 132 is connected with the stacked body 11G. It is preferable that cross-sectional area of the branch section 121 of each of the top electrodes 12 and that of the branch section 131 of each of the bottom electrodes 13 be equal to one another (the cross-sectional area represents an area of a cross-section orthogonal to the direction in which the branch section 121 or 131 extends, for example). It is more preferable that the cross-sectional area and a cross-sectional configuration of the branch section 121 of each of the top electrodes 12 and those of the branch section 131 of each of the bottom electrodes 13 be equal to one another.

The top electrode 12A located at one end of the first MR element 1 is connected with the stacked body 11A, and is also connected to the interconnection L1 illustrated in FIG. 1. The bottom electrode 13H located at the other end of the first MR element 1 is connected with the stacked body 11H, and is also connected to the interconnection L2 illustrated in FIG. 1. With this configuration, a read-out current supplied from the interconnection L1 flows successively through the stacked bodies 11A to 11H to the interconnection L2. At this time, the read-out current flows in each of the stacked bodies 11A to 11H in a direction going from the top electrode 12 to the bottom electrode 13 (i.e., in a minus Z-axis direction). Each of the top electrodes 12, the bottom electrodes 13, and the connectors 14 is configured of a nonmagnetic material having high-electrical conductivity, which can be copper (cu), or other suitable material.

As illustrated in FIG. 1, the second to the fourth MR elements 2 to 4 are provided with top electrodes 22, 32, and 42, bottom electrodes 23, 33, and 43, and connectors 24, 34, and 44, corresponding to the top electrodes 12, the bottom electrodes 13, and the connectors 14 in the first MR element 1, respectively. In the second MR element 2, the top electrode 22 located at one end of the second MR element 2 is connected to the interconnection L1, and the bottom electrode 23 located at the other end of the second MR element 2 is connected to the interconnection L3. In the third MR element 3, the top electrode 32 located at one end of the third MR element 3 is connected to the interconnection L3, and the bottom electrode 33 located at the other end of the third MR element 3 is connected to the interconnection L4. In the fourth MR element 4, the top electrode 42 located at one end of the fourth MR element 4 is connected to the interconnection L2, and the bottom electrode 43 located at the other end of the fourth MR element 4 is connected to the interconnection L4. Also, the interconnection L2 is connected to the pad 53 through the interconnection L5, and the interconnection L3 is connected to the pad 54 through the interconnection L6.

Each of the interconnections L1 to L6 is configured of a nonmagnetic material having high-electrical conductivity, which can be copper (cu), or other suitable material. The interconnections L1 and L3 to L6 are located on a same level as the top electrodes 12, 22, 32, and 42, and the interconnection L2 is located on a same level as the bottom electrodes 13, 23, 33, and 43, for example. Although the interconnections L2 and L5 are located on the different levels from each other, the interconnections L2 and L5 are joined each other in the thickness direction through a columnar member (not illustrated) configured of copper, for example.

Now, a configuration of the stacked bodies 11, 21, 31, and 41 will be described with reference to FIGS. 3A and 3B. FIG. 3A illustrates a schematic cross-sectional configuration of the stacked bodies 11 and 31, whereas FIG. 3B illustrates a schematic cross-sectional configuration of the stacked bodies 21 and 41. Each of the stacked bodies 11, 21, 31, and 41 includes a magnetization free layer 61, an interposition layer 62, a magnetization fixed layer 63, and an antiferromagnetic layer 64 in this order from a side on which the top electrodes 12, 22, 32, and 42 are provided. In one embodiment, an overcoat film may be so provided as to cover a surface of the magnetization free layer 61 facing the top electrodes 12, 22, 32, and 42 side. Also, in one embodiment, a seed layer may be provided between the antiferromagnetic layer 64 and the substrate 100.

The magnetization free layer 61 is a soft ferromagnetic layer in which a magnetization direction J61 changes in response to an external magnetic field such as the signal magnetic field, and has a magnetization easy axis in a plus X-axis direction, for example. It is preferable that all of the magnetization free layers 61 among the first to the fourth MR elements 1 to 4 have the magnetization easy axis in the same direction to one another (plus X-axis direction). The magnetization free layer 61 is configured of a nickel-iron alloy (NiFe) or other suitable material, for example.

The interposition layer 62 is a nonmagnetic tunnel barrier layer obtained by subjecting a thin film of magnesium (Mg) to an oxidation process, for example. The interposition layer 62 has a thickness which is thin enough that a quantum mechanical tunneling current is possible to pass therethrough. Thus, in this embodiment, each of the stacked bodies 11, 21, 31, and 41 establishes a so-called magnetic tunnel junction element (MTJ) film or a so-called tunnel magnetoresistive (TMR) film, although it is not limited thereto.

The antiferromagnetic layer 64 is configured of an antiferromagnetic material, which can be a platinum-manganese alloy (PtMn), an iridium-manganese alloy (IrMn), or other suitable material. The antiferromagnetic layer 64 has a state in which a spin magnetic moment in a plus Y-axis direction and a spin magnetic moment in a minus Y-axis direction are completely offset each other, and acts to fix an orientation of a magnetization J633 in an adjacent pinned layer 633 to the plus Y-axis direction or to the minus Y-axis direction, for example.

The magnetization fixed layer 63 has a synthetic structure including a pinned layer 631, a coupling layer 632, and the pinned layer 633, in order from the interposition layer 62 side. The pinned layer 633 is indirectly exchange coupled to the pinned layer 631 through the coupling layer 632. That is, an orientation of a magnetization J631 of the pinned layer 631 is antiparallel to the orientation of the magnetization J633 of the pinned layer 633. However, in the stacked bodies 11 and 31, a total magnetic moment $M_{IP}$ of the pinned layer 631 is equal to or larger in value than a total magnetic moment $M_{OP}$ of the pinned layer 633. On the other hand, in the stacked bodies 21 and 41, the total magnetic moment $M_{OP}$ of the pinned layer 633 is larger than the total magnetic moment $M_{IP}$ of the pinned layer 631. As used herein, the terms "total magnetic moment $M_{IP}$" and "total magnetic moment $M_{OP}$" each refer to a product of a "magnetic moment Ms per unit volume" of respective materials structuring the pinned layers 631 and 633 and a volume of the respective pinned layers 631 and 633. In FIGS. 3A and 3B, a magnitude of the total magnetic moment $M_{IP}$ of the pinned layer 631 and a magnitude of the total magnetic moment $M_{OP}$ of the pinned layer 633 are each represented by a relative length of an arrow indicating the orientation of the magnetization J631 or the magnetization J633. For example, a difference between the magnitude of the total magnetic moment $M_{IP}$ and that of the total magnetic moment $M_{OP}$ is achieved by structuring each of the pinned layers 631 and 633 with a material different from each other, and/or by structuring each of the pinned layers 631 and 633 to have a thickness different from each other.

As described, the difference in magnitude is provided between the total magnetic moment $M_{IP}$ of the pinned layer 631 and the total magnetic moment $M_{OP}$ of the pinned layer 633. Thus, when the stacked bodies 11 to 41 are heated while an applied magnetic field is applied thereto in the plus Y-axis direction during an annealing step of a fabrication process, a mutually-different behavior is generated in the stacked bodies 11, 31 and in the stacked bodies 21, 41. That is, in the stacked bodies 11 and 31, the magnetization J631 of the pinned layer 631 is fixed in the plus Y-axis direction, and the magnetization J633 of the pinned layer 633 is fixed in the minus Y-axis direction, as illustrated in FIG. 3A. In contrast, in the stacked bodies 21 and 41, the magnetization J631 of the pinned layer 631 is fixed in the minus Y-axis direction, and the magnetization J633 of the pinned layer 633 is fixed in the plus Y-axis direction, as illustrated in FIG. 3B. Consequently, the direction of the magnetization J631 of the pinned layer 631 is mutually different between the stacked bodies 11, 31 and the stacked bodies 21, 41. Thus, in the stacked bodies 11 and 31, the magnetization J61 is oriented in the direction parallel to the direction of the magnetization J631 when the signal magnetic field Hm in the plus Y-axis direction is applied, to have a low resistance state, whereas in the stacked bodies 21 and 41, the magnetization J61 is oriented in the direction antiparallel to the direction of the magnetization J631, to have a high resistance state. That is, in the magnetic sensor according to this embodiment, the resistance of each of the first and the third MR elements 1 and 3 indicates a change in the orientation opposite to the orientation indicated by the resistance of each of the second and the fourth MR elements 2 and 4 when the signal magnetic field Hm is applied. It is, however, preferable that an absolute value of a difference between the total magnetic moment $M_{IP}$ of the pinned layer 631 and the total magnetic moment $M_{OP}$ of the pinned layer 633 be as small as possible. The reason is that, if the absolute value of the difference in the total magnetic moment is large, the orientation of the magnetization J631 in the pinned layer 631 may slightly change by the application of the signal magnetic field Hm at the time of detecting the signal magnetic field Hm, and thus a relative angle between the magnetization J631 and the magnetization J63 in the magnetization free layer 61 may deviate from a proper angle, and may appear as a detection error.

The pinned layers 631 and 633 are each configured of a ferromagnetic material, which can be cobalt (Co), a cobalt-iron alloy (CoFe), a cobalt-iron-boron alloy (CoFeB), or other suitable material. The coupling layer 632 is configured of a nonmagnetic material having high-electrical conductivity, which can be ruthenium (Ru), or other suitable material. Each of the pinned layers 631 and 633 may have a single-layer configuration, or may have a multi-layer configuration including a plurality of layers.

It is preferable that the absolute value of the difference between the total magnetic moment $M_{IP}$ of the pinned layer 631 and the total magnetic moment $M_{OP}$ of the pinned layer 633 in the stacked bodies 11 and 31 be different from the absolute value of the difference between the total magnetic moment $M_{IP}$ of the pinned layer 631 and the total magnetic moment $M_{OP}$ of the pinned layer 633 in the stacked bodies 21 and 41. The reasons are that, as will be described later, the directions of the magnetization J631 and J633 are fixed with higher accuracy when the magnetic sensor is fabricated, and that a resistance change value (a MR ratio) in the stacked bodies 11, 21, 31, and 41 advantageously improves.

Figure 4:
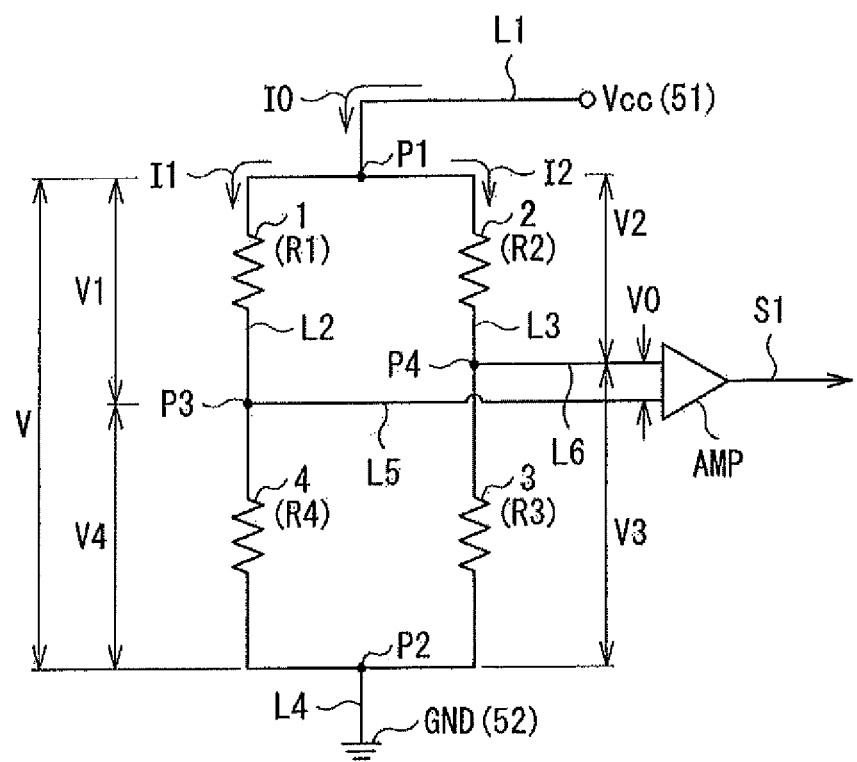
FIG. 4 is a circuit diagram illustrating a configuration of a magnetic field detecting circuit in the magnetic sensor illustrated in FIG. 1.

FIG. 4 schematically illustrates a configuration of a magnetic field detecting circuit in the magnetic sensor. One end of the first MR element 1 and one end of the second MR element 2 are connected together in a first connection point P1, and one end of the third MR element 3 and one end of the fourth MR element 4 are connected together in a second connection point P2. Further, the other end of the first MR element 1 and the other end of the fourth MR element 4 are connected together in a third connection point P3, and the other end of the second MR element 2 and the other end of the third MR element 3 are connected together in a fourth connection point P4, to establish a bridge circuit. The first connection point P1 is connected to the power source Vcc through the interconnection L1, and the second connection point P2 is grounded through the interconnection L4. The third connection point P3 and the fourth connection point P4 are connected to input terminals of the difference detector AMP through the interconnection L5 and the interconnection L6, respectively. The difference detector AMP detects a potential difference between the third connection point P3 and the fourth connection point P4 when a voltage is applied between the first connection point P1 and the second connection point P2 (i.e., a difference in a voltage drop generated in each of the first and the second MR elements 1 and 2), and outputs the detected potential difference as a difference signal S1.

Now, a detecting method, based on the difference signal S1, of the signal magnetic field Hm as a detection target by using the magnetic sensor according to this embodiment will be described.

Referring to FIG. 4, the description will be given first on a state where the signal magnetic field Hm is not applied. In the following, the resistances of the first to the fourth MR elements 1 to 4 when a read-out current I0 is caused to flow from the power source Vcc are referred to as r1 to r4, respectively. The read-out current I0 from the power source Vcc is divided into a read-out current I1 and a read-out current I2 in the first connection point P1. Thereafter, the read-out current I1, having passed through the first MR element 1 and the third MR element 3, and the read-out current I2, having passed through the second MR element 2 and the fourth MR element 4, are merged at the second connection point P2. Here, a potential difference V between the first connection point P1 and the second connection point P2 is expressed as follows.

$$V = I1 \times r4 + I1 \times r1 = I2 \times r3 + I2 \times r2 \qquad \text{Equation (1)}$$
$$= I1(r4 + r1) = I2(r3 + r2)$$

Also, a potential difference V1 at the third connection point P3 and a potential difference V2 at the fourth connection point P4 are each expressed as follows.

$$V1 = V - V4$$
$$= V - I1 \times r4$$
$$V2 = V - V3$$
$$= V - I2 \times r3$$

Therefore, a potential difference V0 between the third connection point P3 and the fourth connection point P4 is expressed as follows.

$$V0 = V1 - V2 \quad\quad \text{Equation (2)}$$
$$= (V - I1 \times r4) - (V - I2 \times r3)$$
$$= I2 \times r3 - I1 \times r4$$

Here, a following Equation (3) is established from the Equation (1).

$$V0 = r3/(r3 + r2) \times V - r4/(r4 + r1) \times V \quad\quad \text{Equation (3)}$$
$$= \{r3/(r3 + r2) - r4/(r4 + r1)\} \times V$$

In the bridge circuit described above, an amount of resistance change is obtained by measuring the potential difference V0 between the third and the fourth connection points P3 and P4 expressed by the Equation (3) when the signal magnetic field Hm is applied. Here, when assuming that the resistances r1 to r4 are increased by change amounts ΔR1 to ΔR4 at the time when the signal magnetic field Hm is applied, respectively, that is, when resistances R1 to R4 at the time of the application of the signal magnetic field Hm are expressed as: R1=r1+ΔR1; R2=r2+ΔR2; R3=r3+ΔR3; and R4=r4+ΔR4, respectively, the potential difference V0 at the time when the signal magnetic field Hm is applied is expressed, from the Equation (3), as follows.

$$V0=\{(r3+\Delta R3)/(r3+\Delta R3+r2+\Delta R2)-(r4+\Delta R4)/(r4+\Delta R4+r1+\Delta R1)\}\times V \quad \text{Equation (4)}$$

As already described above, since, in the magnetic sensor according to this embodiment, the resistances R1 and R3 of the first and the third MR elements 1 and 3, and the resistances R2 and R4 of the second and the fourth MR elements 2 and 4, change in the directions opposite to each other, the change amount ΔR3 and the change amount ΔR2 offset each other, and the change amount ΔR4 and the change amount ΔR1 offset each other. Thus, there is hardly any increase in denominator in each term in the Equation (4) when comparing a state before the application of the signal magnetic field Hm and a state after the application of the signal magnetic field Hm. On the other hand, as for numerator in each term in the Equation (4), since the change amount ΔR3 and the change amount ΔR4 both have opposite signs to each other, the change amount ΔR3 and the change amount ΔR4 do not offset each other and thus increase or decrease appears in the numerator. This is because, by the application of the signal magnetic field Hm, the resistances of the second and the fourth MR elements 2 and 4 change by the change amounts ΔR2 and ΔR4 (ΔR2, ΔR4<0), respectively (i.e., the resistances thereof substantially decrease), whereas the resistances of the first and the third MR elements 1 and 3 change by the change amounts ΔR1 and ΔR3 (ΔR1, ΔR3>0), respectively (i.e., the resistance values thereof substantially increase).

If assuming that all of the first to the fourth MR elements 1 to 4 have completely the same characteristics, that is, if: r1=r2=r3=r4=R; and ΔR1=−ΔR2=ΔR3=−ΔR4=ΔR are established, the Equation (4) would be as follows.

$$V0 = \{(R + \Delta R)/(2 \times R) - (R - \Delta R)/(2 \cdot R)\} \times V$$
$$= (\Delta R / R) \times V$$

Consequently, it is possible to measure the magnitude of the signal magnetic field Hm, by using the first to the fourth MR elements 1 to 4 in which a relationship between the external magnetic field and the amounts of resistance changes is known.

In the first MR element 1, the read-out current I1, having entered the top electrode 12, passes through the stacked body 11, and then flows out to the bottom electrode 13, as indicated by arrows in FIG. 2. Here, the branch section 122 of the top electrode 12, which is in contact with the upper surface of the stacked body 11, and the branch section 132 of the bottom electrode 13, which is in contact with the lower surface of the stacked body 11, are positioned to oppose each other in the stack direction. In addition thereto, a direction of the read-out current I1 flowing in the branch section 122 and that of the read-out current I1 flowing in the branch section 132 become opposite to each other. Thus, an induction magnetic field generated around the branch section 122 and that generated around the branch section 132 cancel each other. Also, since each of the stacked bodies 11 is coupled with the branch section 122 of the top electrode 12 and with the branch section 132 of the bottom electrode 13, each of the stacked bodies 11 is disposed at a position having a distance from the stem sections 121 and 131 to some extent. Thus, an influence of the induction magnetic field, caused by the read-out current I1 flowing in the stem sections 121 and 131, on each of the stacked bodies 11 is reduced. These also apply to the second to the fourth MR elements 2 to 4 as well.

Now, a method of manufacturing the magnetic sensor will be described with reference to FIGS. 5 to 16B. FIGS. 5 to 16B each illustrate a region near a boundary between the first MR element 1 and the second MR element 2 in an expanded manner. FIGS. 7A to 16A are views as seen from above, and FIGS. 7B to 16B are cross-sectional views corresponding to sectional lines illustrated in FIGS. 7A to 16A, respectively.

Figure 5:
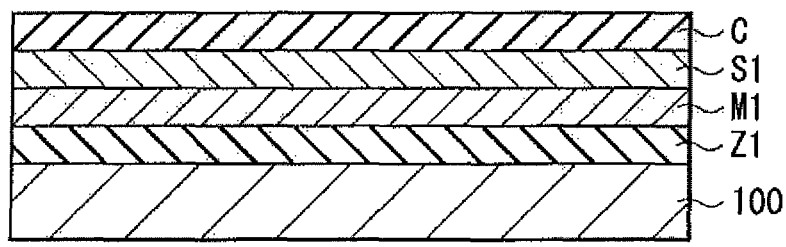
FIG. 5 is a cross-sectional view illustrating a process in a manufacturing method of the magnetic sensor illustrated in FIG. 1.

Referring to FIG. 5, the substrate 100 which may be configured of the material described above is provided, and as needed, an insulating layer Z1 is provided on a surface of the substrate 100. Then, a metal film M1, which will eventually become the bottom electrodes 13, 23, 33, and 43, is so formed as to cover throughout a surface of the insulating layer Z1 by using a material such as copper. Further, an MR film S1, which will eventually become the stacked bodies 11 and 31, is so formed as to cover throughout a surface of the metal film M1. The MR film S1 is obtained by stacking the antiferromagnetic layer 64, the pinned layer 633, the coupling layer 632, the pinned layer 631, the interposition layer 62, and the magnetization free layer 61 sequentially on the metal film M1 by using a sputtering method, for example. Herein, the MR film S1 is so formed that the total magnetic moment $M_{IP}$ of the pinned layer 631 becomes equal to or larger than the total magnetic moment $M_{OP}$ of the pinned layer 633. In one embodiment, at the time of deposition of the MR film S1, a magnetic field having a predetermined magnitude may be applied along a direction in which the magnetization J631 of the pinned layer 631 and the magnetization J633 of the pinned layer 633 are fixed in the later-described annealing process. As needed, a hard mask such as a carbon may be so formed, as a protecting film C, to cover throughout a surface of the MR film S1.

Figure 6:
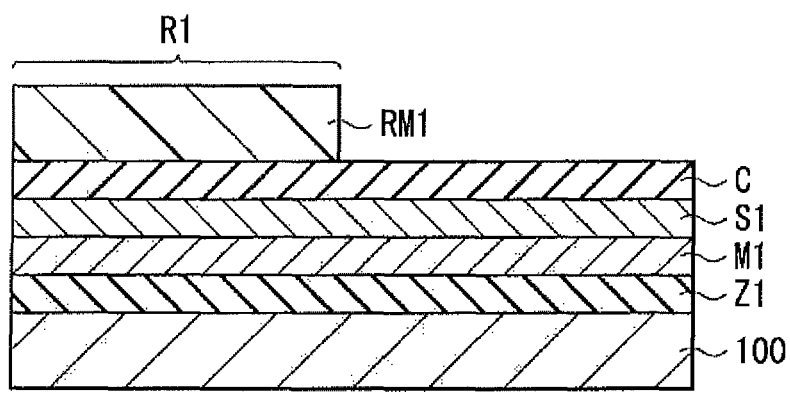
FIG. 6 is a cross-sectional view illustrating a process subsequent to that in FIG. 5.
Figure 7A:
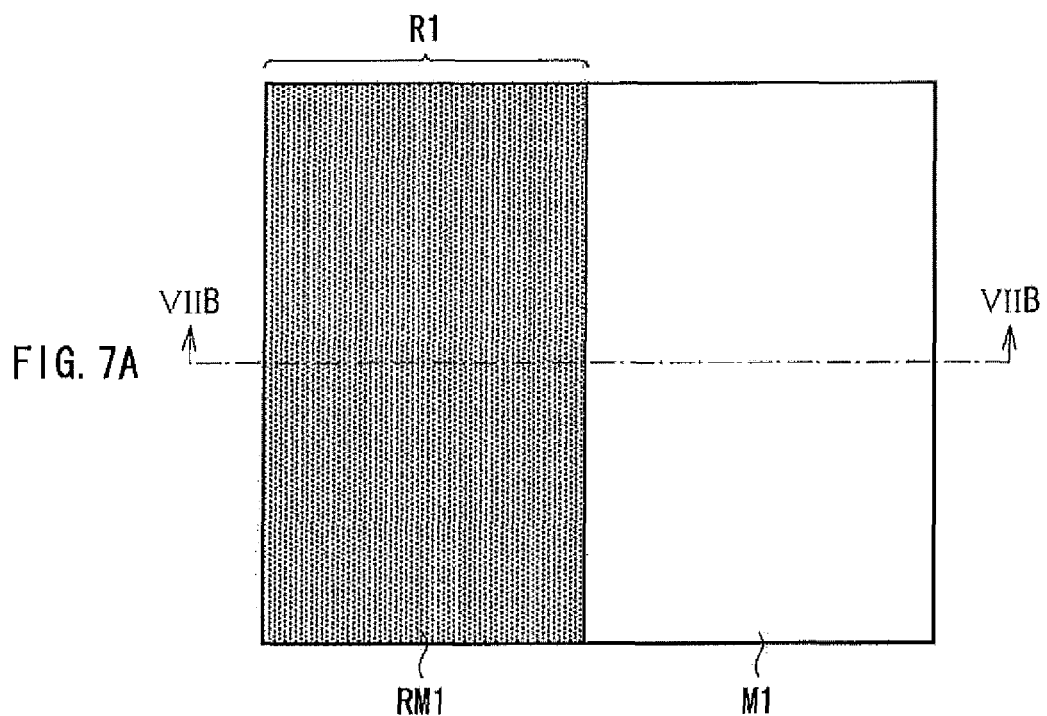
FIG. 7A and FIG. 7B are a plan view and a cross-sectional view illustrating a process subsequent to that in FIG. 6, respectively.
Figure 7B:
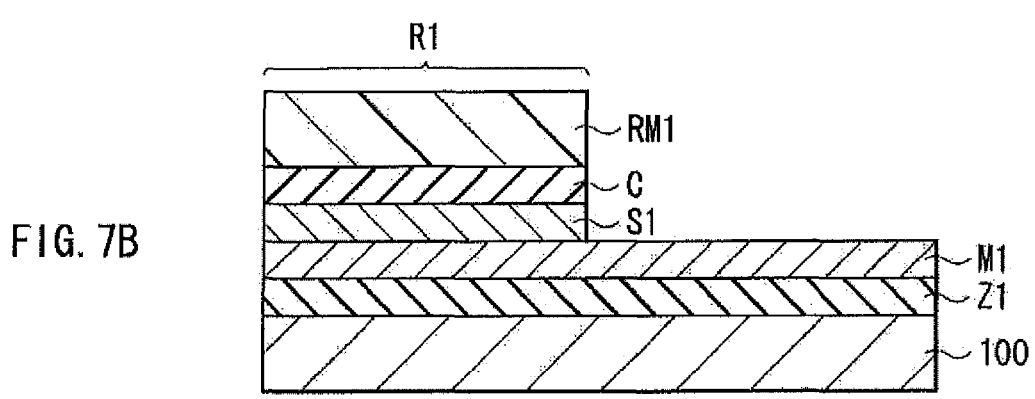

Then, as illustrated in FIG. 6, a resist mask RM1 is so selectively formed to cover only a region R1 in which the first MR element 1 and the third MR element 3 will eventually be formed. Then, as illustrated in FIGS. 7A and 7B, the protecting film C and the MR film S1 in an exposed region are so selectively removed as to leave the protecting film C and the MR film S1 in the region R1, by using a milling process. The milling process performed here finishes when the milling process reaches the metal film M1.

Figure 8A:
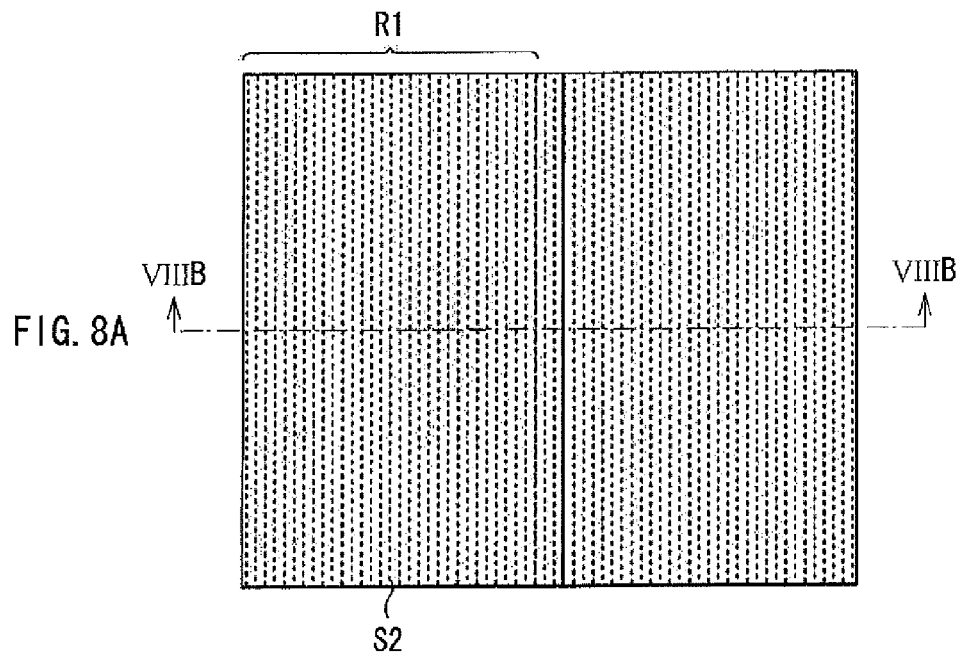
FIG. 8A and FIG. 8B are a plan view and a cross-sectional view illustrating a process subsequent to that in FIGS. 7A and 7B, respectively.
Figure 8B:
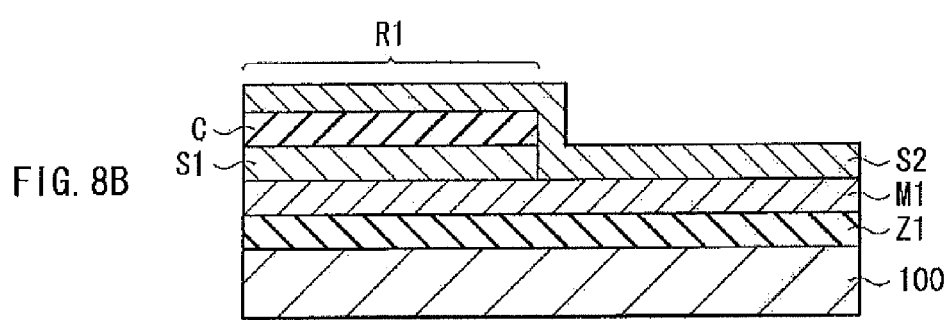
Figure 9A:
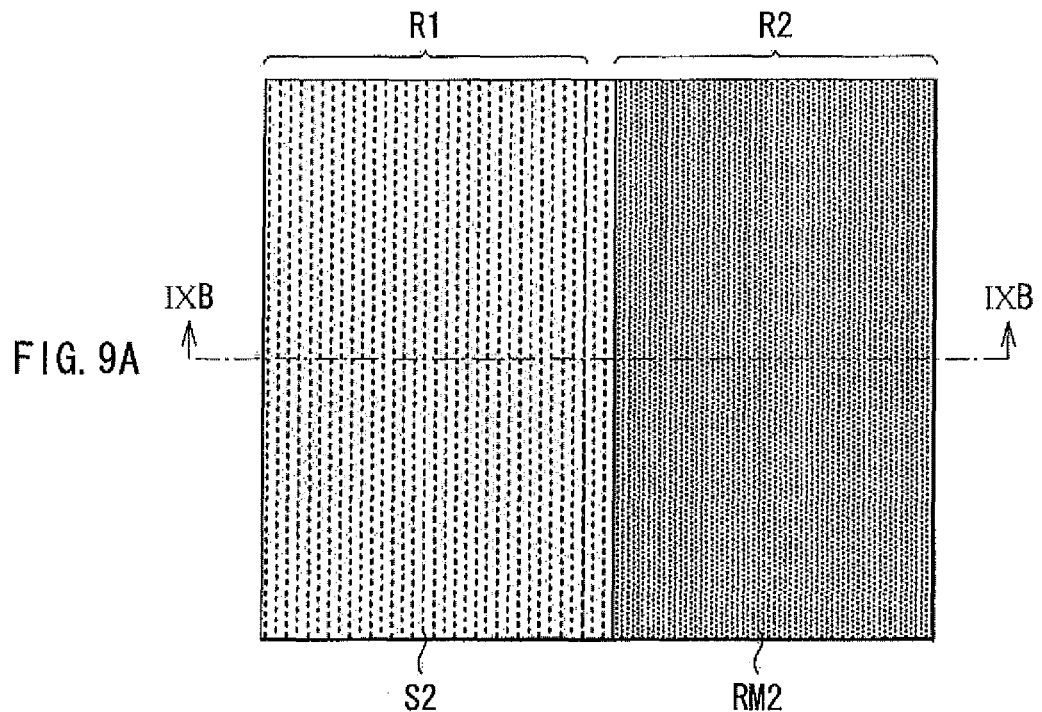
FIG. 9A and FIG. 9B are a plan view and a cross-sectional view illustrating a process subsequent to that in FIGS. 8A and 8B, respectively.
Figure 9B:
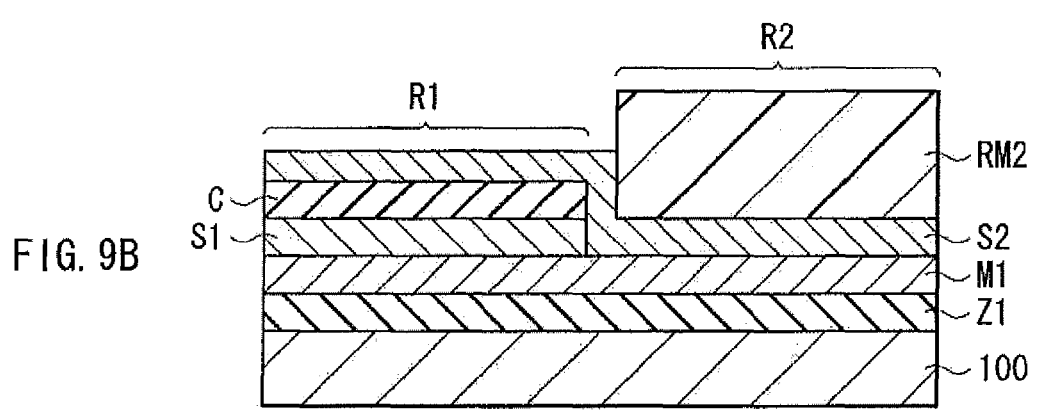
Figure 10A:
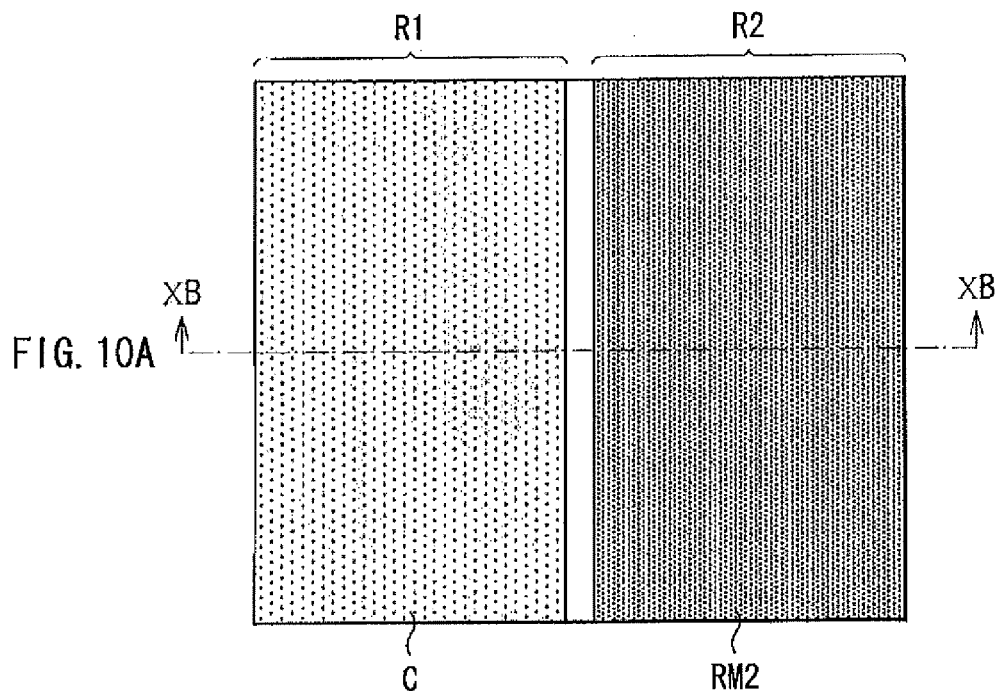
FIG. 10A and FIG. 10B are a plan view and a cross-sectional view illustrating a process subsequent to that in FIGS. 9A and 9B, respectively.
Figure 10B:
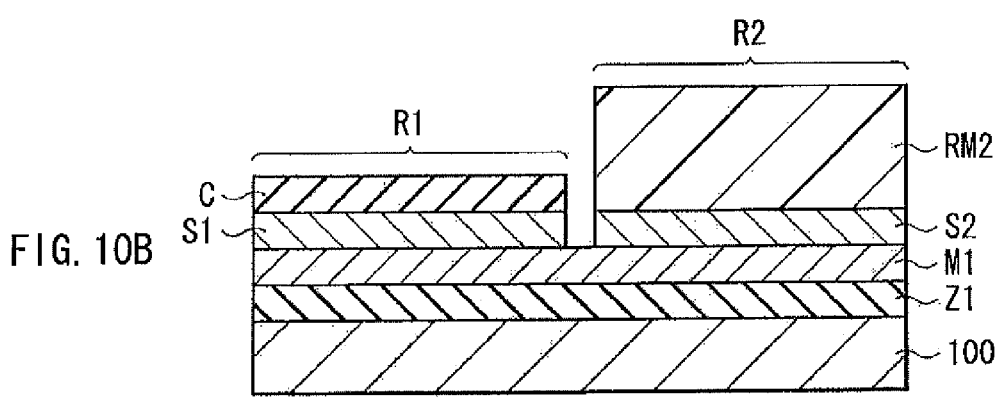

Then, the resist mask RM1 is dissolved to remove the same, and a MR film S2, which will eventually become the stacked bodies 21 and 41, is thereafter so formed as to cover throughout a surface as illustrated in FIGS. 8A and 8B. The MR film S2 may be formed by a process procedure similar to that of the MR film S1, for example. However, it is to be noted that the process procedure of the MR film S2 differs from that of the MR film S1, in that each of the pinned layer 631 and the pinned layer 633 is so formed that the total magnetic moment $M_{OP}$ of the pinned layer 633 becomes larger than the total magnetic moment $M_{IP}$ of the pinned layer 631. Then, after the MR film S2 is formed, a resist mask RM2 is so selectively formed as to cover only a region R2 in which the second MR element 2 and the fourth MR element 4 will eventually be formed, as illustrated in FIGS. 9A and 9B. Then, as illustrated in FIGS. 10A and 10B, the MR film S2 in an exposed region is so selectively removed as to leave the MR film S2 in the region R2, by using a milling process. The milling process performed here finishes when the milling process reaches the metal film M1 or the protecting film C.

Then, as illustrated in FIGS. 11A and 11B, the resist mask RM2 is dissolved to remove the same, and the protecting film C is removed by using an ashing process. Thereafter, the annealing process is performed. For example, a heating is performed at a predetermined temperature of 250 degrees centigrade while applying an applied magnetic field H1 in the plus Y-axis direction, to collectively set the direction of the magnetization J631 in the pinned layer 631 and the direction of the magnetization J633 in the pinned layer 633. At this time, a balance (i.e., a relationship in magnitude) between the total magnetic moment $M_{IP}$ and the total magnetic moment $M_{OP}$ allows the magnetization J631 in the stacked bodies 11 and 31 to be in the plus Y-axis direction, and allows the magnetization J631 in the stacked bodies 21 and 41 to be in the minus Y-axis direction. It is preferable that the applied magnetic field H1 here have an intensity to an extent capable of maintaining the synthetic structure of the magnetization fixed layer 63, that is, the intensity to an extent in which an indirect exchange coupling between the pinned layer 631 and the pinned layer 633 is maintained.

Figure 12A:
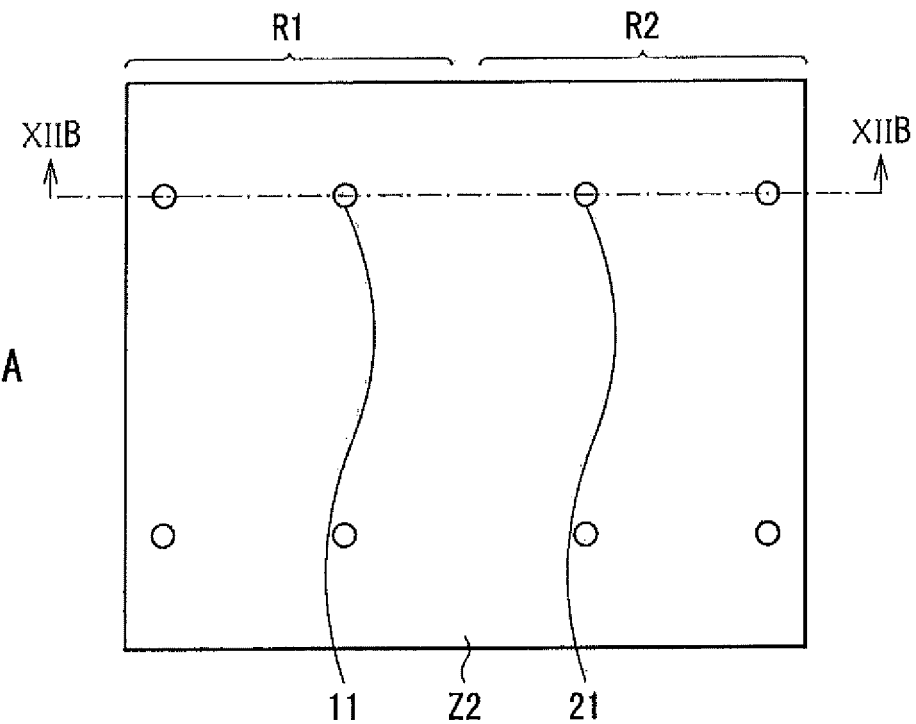
FIG. 12A and FIG. 12B are a plan view and a cross-sectional view illustrating a process subsequent to that in FIGS. 11A and 11B, respectively.
Figure 12B:
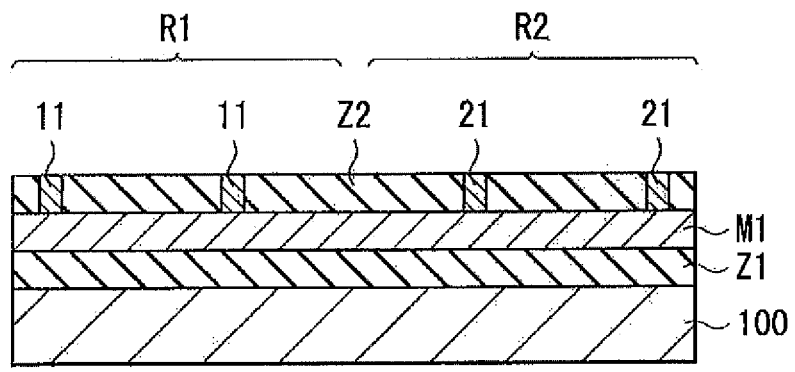

Then, as illustrated in FIGS. 12A and 12B, after performing the annealing process, the MR films S1 and S2 are patterned to form, at predetermined positions, the columnar stacked bodies 11, 21, 31, and 41 each having a predetermined planar configuration and size. Further, as illustrated in FIGS. 12A and 12B, an insulating layer Z2 is so formed as to embed around the columnar stacked bodies 11, 21, 31, and 41, by using a material such as $Al_2O_3$, for example. Incidentally, the stacked bodies 31 and 41 are not illustrated in FIGS. 12A and 12B.

Figure 13A:
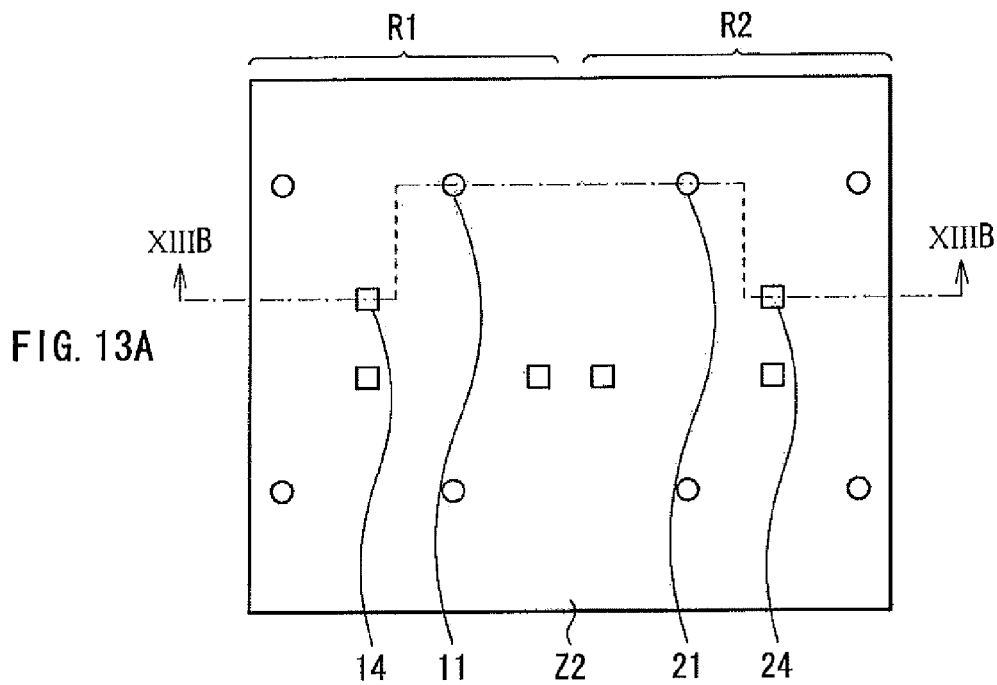
FIG. 13A and FIG. 13B are a plan view and a cross-sectional view illustrating a process subsequent to that in FIGS. 12A and 12B, respectively.
Figure 13B:
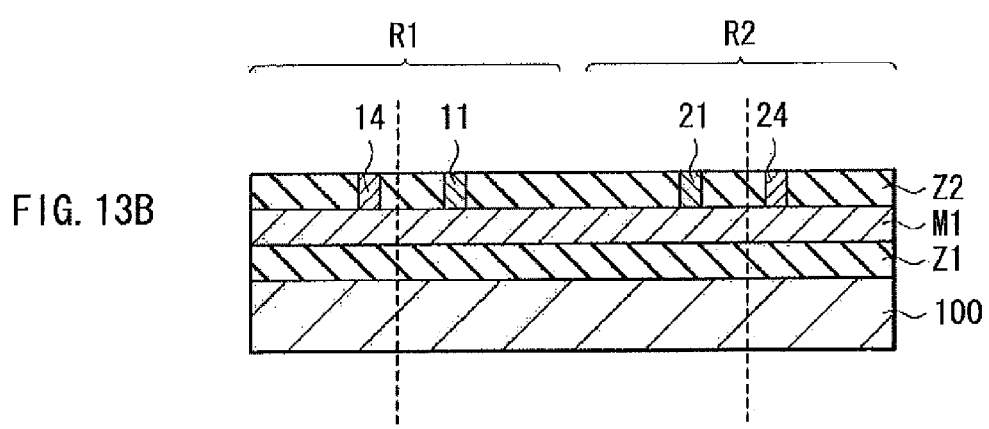
Figure 14A:
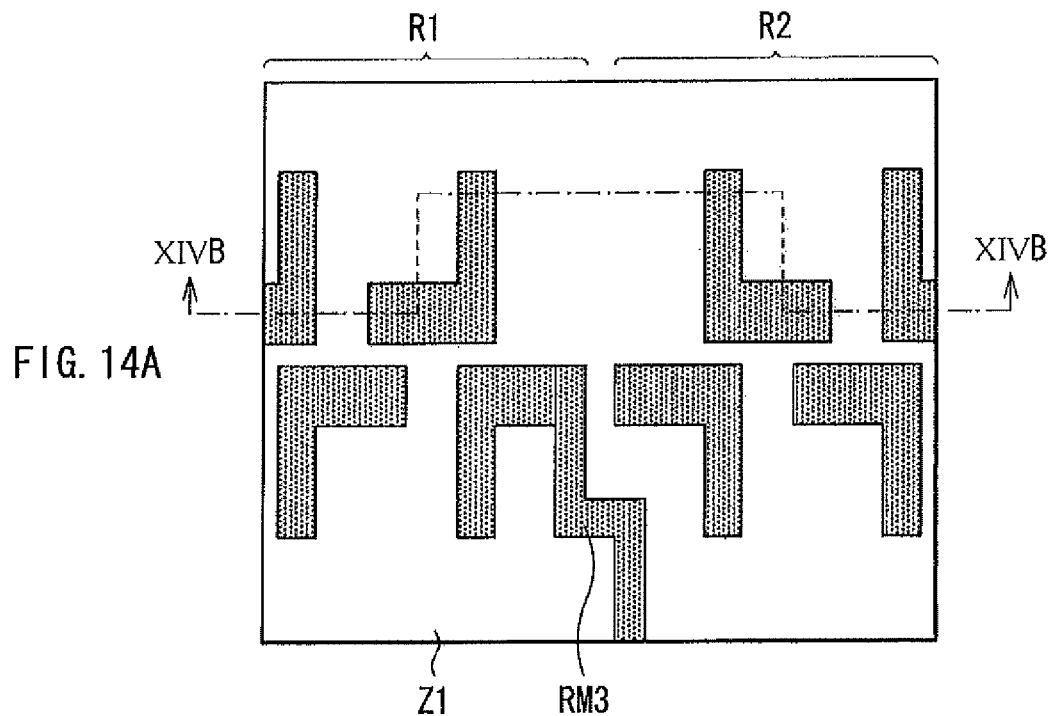
FIG. 14A and FIG. 14B are a plan view and a cross-sectional view illustrating a process subsequent to that in FIGS. 13A and 13B, respectively.
Figure 14B:
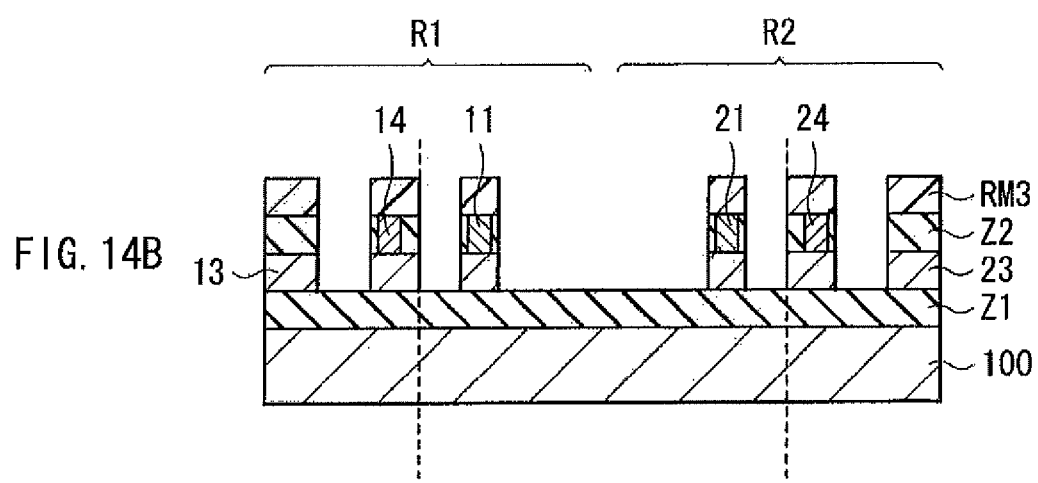

Then, as illustrated in FIGS. 13A and 13B, the connectors 14, 24, 34, and 44 are so formed as to stand at predetermined positions (the connectors 34 and 44 are not illustrated in FIGS. 13A and 13B). Then, as illustrated in FIGS. 14A and 14B, the stacked bodies 11 to 41, the connectors 14 to 44, and neighborhood regions thereof are selectively covered by a resist mask RM3, to perform a milling process on the metal film M1 located in unprotected regions. As a result, the bottom electrodes 13, 23, 33, and 43, and the interconnection L2 are obtained.

Figure 15A:
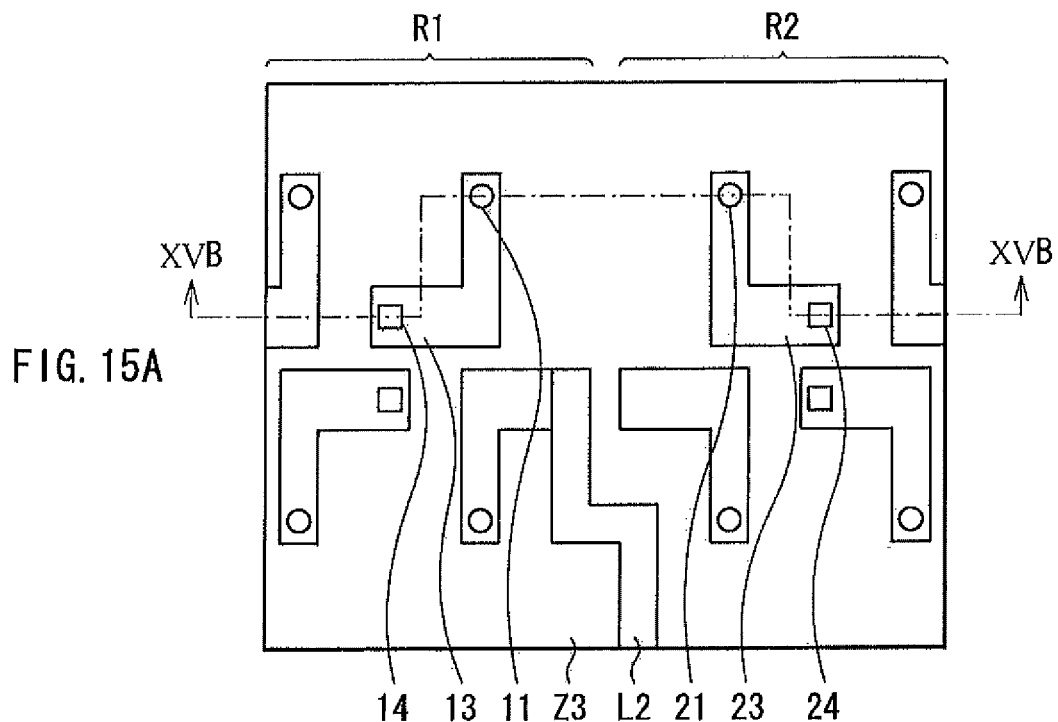
FIG. 15A and FIG. 15B are a plan view and a cross-sectional view illustrating a process subsequent to that in FIGS. 14A and 14B, respectively.
Figure 15B:
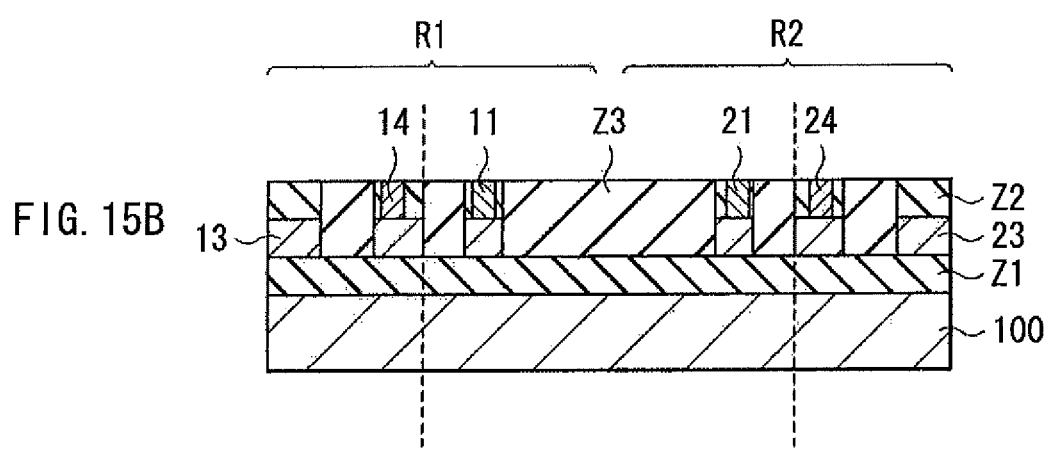

Then, as illustrated in FIGS. 15A and 15B, an insulating layer Z3 is so formed as to embed the regions in which the metal film M1 is removed by the milling process, by using material such as $Al_2O_3$, for example. Thereafter, the resist mask RM3 is dissolved to remove the same.

Figures 16A, 16B:
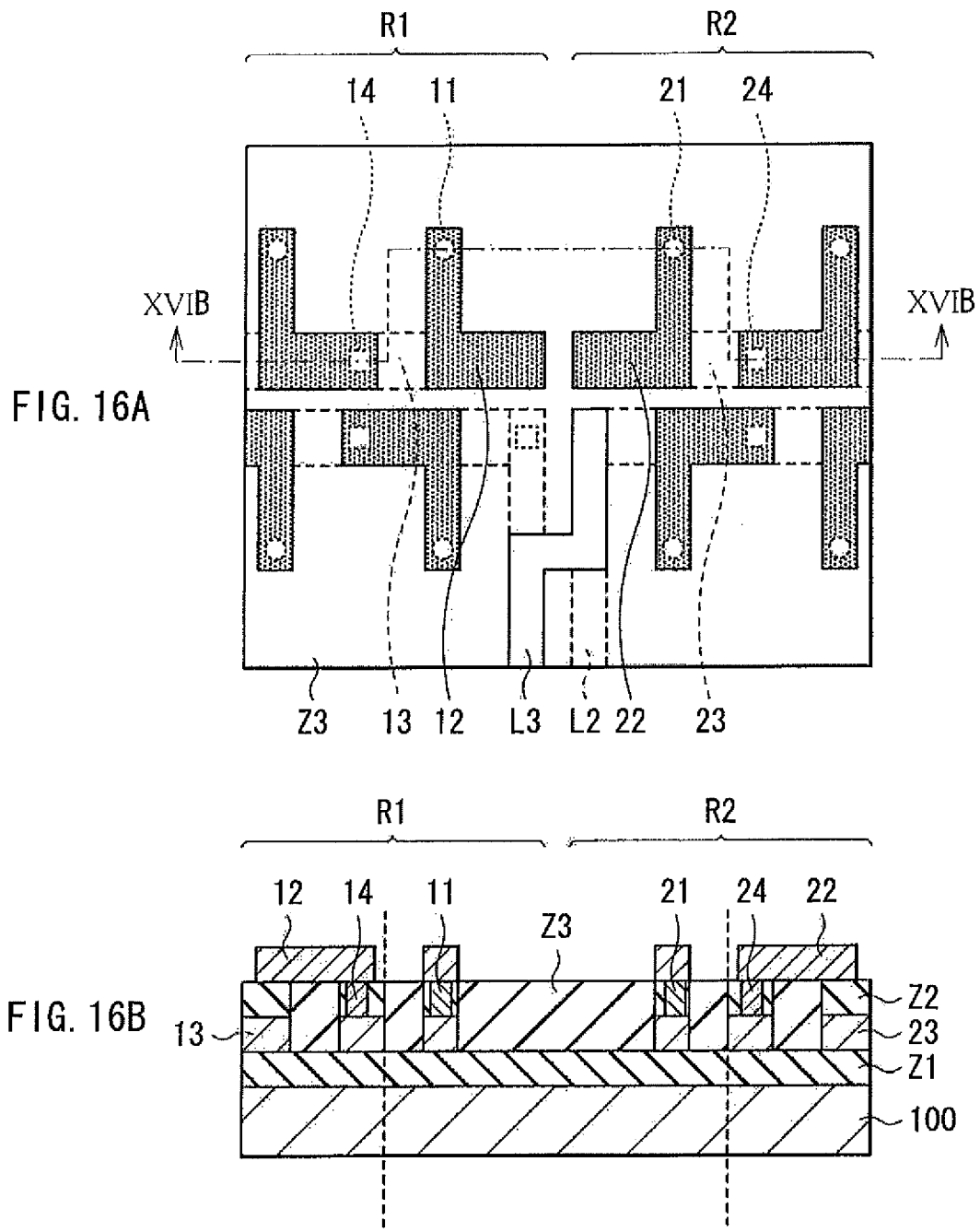
FIG. 16A and FIG. 16B are a plan view and a cross-sectional view illustrating a process subsequent to that in FIGS. 15A and 15B, respectively.

Then, as illustrated in FIGS. 16A and 16B, the top electrodes 12, 22, 32, and 42 (only the upper electrodes 12 and 22 are illustrated in FIGS. 16A and 16B), each having a predetermined shape, are so formed as to contact with the upper surface of the stacked bodies 11 to 41 and the upper surface of the connectors 14 to 44. Also, the interconnections L1 and L3 to L6 (only the interconnection L3 is illustrated in FIGS. 16A and 16B) are formed. Finally, a predetermined process, such as a forming process of the pads 51 to 54 and so forth, is performed to complete the magnetic sensor according to this embodiment.

Therefore, according to this embodiment, in the first MR element 1, each of the stacked bodies 11, connected in series to one another, is disposed between the branch section 122 of the top electrode 12 and the branch section 132 of the bottom electrode 13, which are opposed to each other in the thickness direction. This makes it possible to allow the direction of the read-out current I1 flowing in the branch section 122 of the top electrode 12 and that of the read-out current I1 flowing in the branch section 132 of the bottom electrode 13 to be opposite to each other. Thereby, the induction magnetic field generated around the branch section 122 of the top electrode 12 and that generated around the branch section 132 of the bottom electrode 13 cancel each other. Thus, it is possible to reduce an adverse effect of the unnecessary induction magnetic field caused by the read-out current I1 on the stacked bodies 11. Also, in this embodiment, each of the stacked bodies 11 is connected with the branch sections 122 and 132. Thus, each of the stacked bodies 11 is provided away from the stem sections 121 and 131. Thus, it is possible to reduce an adverse effect of the induction magnetic field caused by the read-out current I1 flowing in the stem sections 121 and 131 on the stacked bodies 11. These also apply to the second to the fourth MR elements 2 to 4 as well. Therefore, according to the magnetic sensor of this embodiment, it is possible to detect the magnetic field highly sensitively, while having a compact structure. In contrast, as to Japanese Unexamined Patent Application Publication No. 2001-102659, it may appear, at the first glance, that JP2001-102659A has a configuration similar to the configuration according to this embodiment, as illustrated in FIGS. 1 to 4 of JP2001-102659A. However, a top electrode and a bottom electrode in the configuration disclosed in JP2001-102659A each do not have elements corresponding to the stem section and the branch section according to this embodiment. Thus, a read-out current flowing in the top electrode and that flowing in the bottom electrode are substantially unidirectional. Further, in JP2001-102659A, the top electrode extending in a region between adjacent magnetic-tunnel resistive elements is located at a height position corresponding to the magnetic-tunnel resistive elements in an in-plane direction of stack. Therefore, an induction magnetic field due to the read-out current flowing in the top electrode and an induction magnetic field due to the read-out current flowing in the bottom electrode may not sufficiently offset each other in the configuration disclosed in JP2001-102659A.

Also, according to this embodiment, the relationship in magnitude between the total magnetic moment $M_{IP}$ of the pinned layer 631 and the total magnetic moment $M_{OP}$ of the pinned layer 633 in the magnetization fixed layer 63 having the synthetic structure is adjusted to have the configuration in which each of the first and the third MR elements 1 and 3 and each of the second and the fourth MR elements 2 and 4 exhibit the mutually-different (mutually-opposite) behaviors. This makes it possible to manufacture the magnetic sensor, provided with the first to the fourth MR elements 1 to 4 which are connected in full-bridge configuration on the same substrate, easily and with high precision, since the magnetic sensor according to this embodiment is manufacturable without using special facilities such as a laser irradiation system, an electron beam irradiation system and so forth, and since the magnetization directions of the magnetization fixed layer 63 is settable by applying the unidirectional applied magnetic field H1 at the time of the annealing process. Such a magnetic sensor according to this embodiment has a compact configuration and yet enables excellent detection of the magnetic field by varying the resistances of the first and the third MR elements 1 and 3 and the resistances of the second and the fourth MR elements 2 and 4 in the directions opposite to each other in response to the signal magnetic field Hm.

[First Modification]

Hereinafter, a first modification of the magnetic sensor according to the first embodiment will be described. In the first embodiment described above, all of the magnetization fixed layers 63 of the stacked bodies 11, 21, 31, and 41 in the first MR elements 1 to 4 have the synthetic structure. However, in the first modification, the magnetization fixed layers 63 in the first and the third MR elements 1 and 3 each may be configured by a single ferromagnetic material layer or by a plurality of ferromagnetic material layers, instead of the synthetic structure. On the other hand, the second and the fourth MR elements 2 and 4 each have the synthetic structure similar to that of the embodiment described above. That is, the total magnetic moment $M_{OP}$ of the pinned layer 633 is made larger than the total magnetic moment $M_{IP}$ of the pinned layer 631.

As in the embodiment described above, this modification also makes it possible to allow the orientation of the magnetization J631 in the first and the third MR elements 1 and 3, and the orientation of the magnetization J631 in the second and the fourth MR elements 2 and 4, to be antiparallel relatively, by performing the heating while applying the unidirectional applied magnetic field H1 at the time of the fabrication process. Therefore, it is possible to achieve effects similar to those of the embodiment described above.

Second Embodiment

Figure 17:
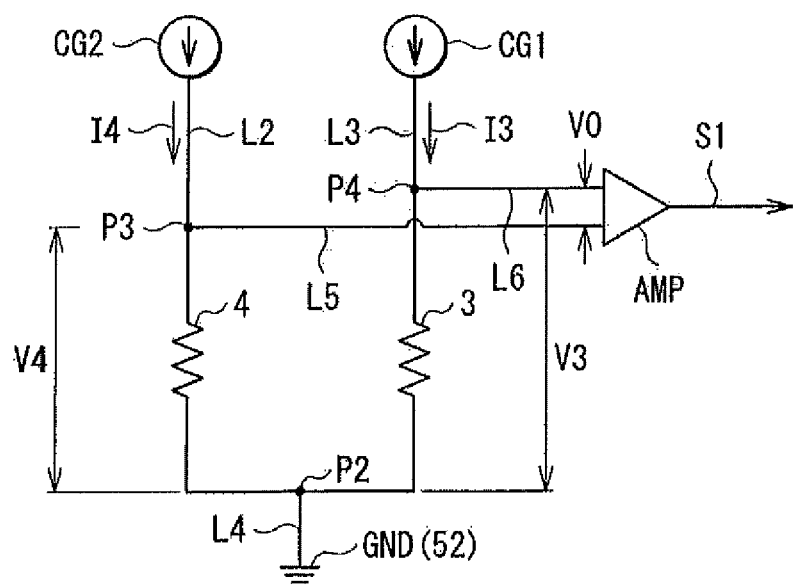
FIG. 17 is a circuit diagram illustrating a configuration of a magnetic field detecting circuit in a magnetic sensor according to a second embodiment.

Now, a configuration of a magnetic sensor according to a second embodiment of the invention will be described with reference to figures including FIG. 17. FIG. 17 schematically illustrates a configuration of a magnetic field detecting circuit in the magnetic sensor according to the second embodiment. The magnetic sensor of this embodiment has a configuration similar to that of the first embodiment described above, except that the first MR element 1 is replaced by a second constant current source CG2, and that the second MR element 2 is replaced by a first constant current source CG1. Note that the same or equivalent elements as those of the first embodiment described above are denoted with the same reference numerals, and will not be described in detail.

Referring to FIG. 17, the first constant current source CG1 and the second constant current source CG2 supply the third MR element 3 and the fourth MR element 4 with a constant current I1 and a constant current I2, having values equal to each other, respectively.

Even with the magnetic sensor according to this embodiment, it is possible to detect the signal magnetic field Hm based on the difference signal S1, as follows.

In FIG. 17, a potential V4 in the third connection point P3 when the signal magnetic field Hm is not applied is expressed as follows, where a constant current supplied from the constant current source CG1 and a constant current supplied from the constant current source CG2 in application of a predetermined voltage between the first connection point P1 and the second connection point P2 are I3 and I4, respectively, and where a resistance of the third MR element 3 and a resistance of the fourth MR element 4 in the application of the predetermined voltage are R3 and R4, respectively.

$$V4 = I4 \times R4$$

Also, a potential V3 in the fourth connection point P4 is expressed as follows.

$$V3 = I3 \times R3$$

Therefore, a potential difference V0 between the third connection point P3 and the fourth connection point P4 is expressed as follows.

$$V0 = V3 - V4 \qquad \text{Equation (5)}$$
$$= I3 \times R3 - I4 \times R4$$

When the constant current I3 and the constant current I4 are equal to each other, that is, when I3=I4=Ic is established, the Equation (5) is expressed as follows.

$$V0 = Ic \times (R3 - R4) \qquad \text{Equation (6)}$$

In this circuit, the resistance change amounts are obtained by measuring the potential difference V0 at the time of the application of the signal magnetic field Hm. For example, when assuming that the resistances R3 and R4 are increased by change amounts ΔR3 and ΔR4 at the time when the signal magnetic field Hm is applied, respectively, the Equation (5) is expressed as follows.

$$V0 = V3 - V4 \qquad \text{Equation (7)}$$
$$= Ic \times (R3 - R4)$$
$$= Ic \times \{(R3 + \Delta R3) - (R4 + \Delta R4)\}$$

When assuming that the third and the fourth MR elements 3 and 4 both have completely the same characteristics, that is, if: R3=R4=R; and ΔR3=−ΔR4=ΔR are established, the Equation (7) would be as follows.

$$V0 = Ic \times (R3 + \Delta R3 - R4 - \Delta R4) \qquad \text{Equation (8)}$$
$$= Ic \times (R + \Delta R - R + \Delta R)$$
$$= Ic \times (2 \times \Delta R)$$

Consequently, it is possible to measure the magnitude of the signal magnetic field Hm, by using the third and the fourth MR elements 3 and 4 in which a relationship between the external magnetic field and the amounts of resistance changes is known.

In the third MR element 3 and the fourth MR element 4, the currents I3 and I4, having entered the top electrodes 32 and 42, pass through the stacked bodies 31 and 41, and then flow to the bottom electrodes 33 and 43, respectively, as in the first MR element 1 of the first embodiment illustrated in FIG. 2. Here, the branch sections 122 of the top electrodes 33 and 43, which are in contact with the upper surfaces of the stacked bodies 31 and 41, and the branch sections 132 of the bottom electrodes 33 and 43, which are in contact with the lower surfaces of the stacked bodies 31 and 41, are positioned to oppose each other in the stack direction, respectively. In addition thereto, a direction of each of the current I3 and the current I4 flowing in the branch sections 122 and that of each of the current I3 and the current I4 flowing in the branch sections 132 become opposite to each other. Thus, the induction magnetic fields generated around the branch sections 122 of the top electrodes 32 and 42 and those generated around the branch sections 132 of the bottom electrodes 33 and 43 cancel each other, respectively. Also, since the stacked bodies 31 and 41 are coupled with the branch sections 122 of the top electrodes 32 and 42 and with the branch sections 132 of the bottom electrodes 33 and 43, respectively, the stacked bodies 31 and 41 are each disposed at a position having a distance from the stem sections 121 and 131 of the top electrodes 32 and 42 and of the bottom electrodes 33 and 43 to some extent. Thus, the influence of the induction magnetic fields, caused by the currents I3 and I4 flowing in the stem sections 121 and 131, on each of the stacked bodies 31 and 41 is reduced.

Therefore, even with the magnetic sensor according to this embodiment, it is possible to detect the magnetic field highly sensitively, while having a compact structure.

Third Embodiment

Now, a configuration of a magnetic sensor according to a third embodiment of the invention will be described with reference to FIGS. 18A and 18B. The magnetic sensor of the third embodiment has a configuration similar to that of the first embodiment described above, except that the first to the fourth MR elements 1 to 4 include stacked bodies 11A, 21A, 31A, and 41A, respectively. Note that the same or equivalent elements as those of the first embodiment described above are denoted with the same reference numerals, and will not be described in detail.

Figure 18A:
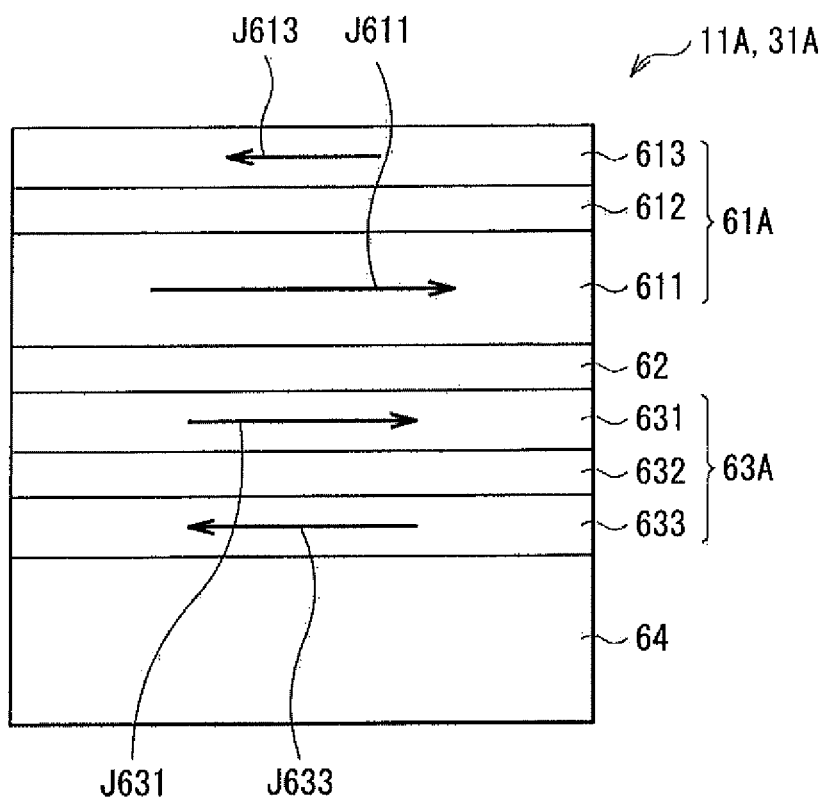
FIG. 18A and FIG. 18B are cross-sectional views each illustrating a structure of a stacked body in a magnetic sensor according to a third embodiment.
Figure 18B:
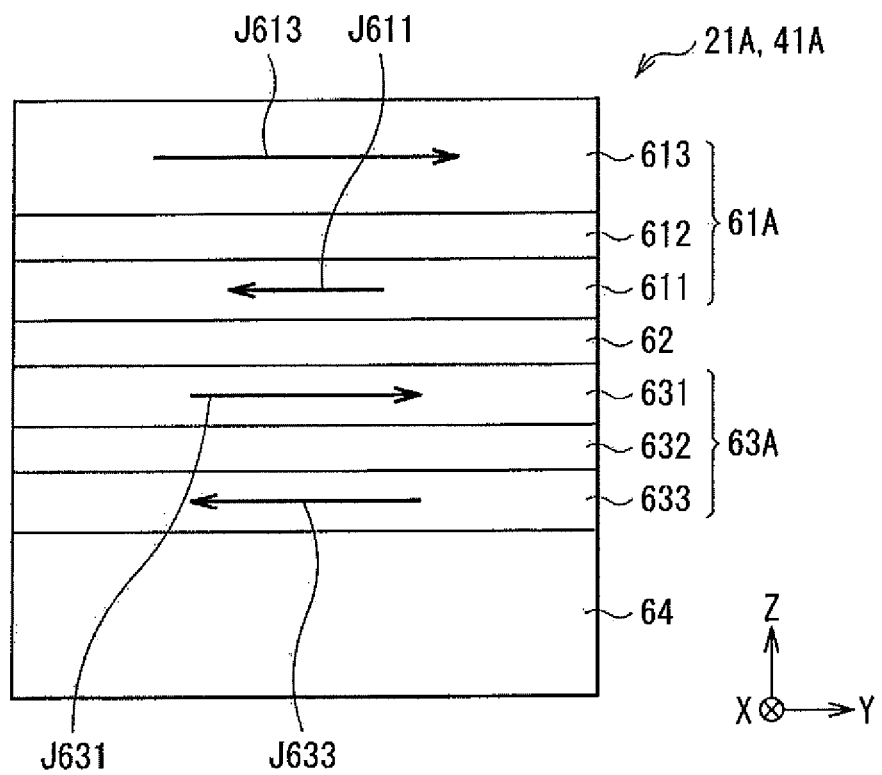

FIG. 18A schematically illustrates a cross-sectional configuration of the stacked bodies 11A and 31A, whereas FIG. 18B schematically illustrates a cross-sectional configuration of the stacked bodies 21A and 41A.

Each of the stacked bodies 11A, 21A, 31A, and 41A has a configuration in which the antiferromagnetic layer 64, a magnetization fixed layer 63A, the interposition layer 62, and a magnetization free layer 61A are stacked in this order. The magnetization fixed layer 63A has a synthetic structure in which the pinned layer 631 and the pinned layer 633 are antiferromagnetically-exchange coupled to each other through the coupling layer 632. However, the difference in the total magnetic moment between the pinned layer 631 and the pinned layer 633 is substantially zero. In one embodiment, the magnetization fixed layer 63A may be configured by a single ferromagnetic material layer or by a plurality of ferromagnetic material layers, instead of the synthetic structure.

The magnetization free layer 61A includes a ferromagnetic layer 611, a coupling layer 612, and a ferromagnetic layer 613 in this order from a side on which the interposition layer 62 is provided. The ferromagnetic layers 611 and 613 are indirectly exchange coupled through the coupling layer 612. Each of the ferromagnetic layers 611 and 613 is configured of a soft magnetic material, which can be NiFe, CoFe, or other suitable material. The coupling layer 612 is configured of a nonmagnetic material having high-electrical conductivity, as with the coupling layer 632. In the stacked bodies 11A and 31A, the ferromagnetic layer 611 has a total magnetic moment which is equal to or larger than a total magnetic moment of the ferromagnetic layer 613. On the other hand, in the stacked bodies 21A and 41A, the ferromagnetic layer 613 has a total magnetic moment which is larger than a total magnetic moment of the ferromagnetic layer 611. Thereby, in the stacked bodies 11A and 31A, a magnetization J611 of the ferromagnetic layer 611, having the larger total magnetic moment relatively, is oriented in the same direction (i.e., in the plus Y-axis direction) as the signal magnetic field Hm when the signal magnetic field Hm is applied in the plus Y-axis direction, as illustrated in FIG. 18A, for example. Thus, a magnetization J613 of the ferromagnetic layer 613, having the smaller total magnetic moment relatively, is oriented in a direction opposite thereto (i.e., in the minus Y-axis direction). On the other hand, in the stacked bodies 21A and 41A, the magnetization J613 of the ferromagnetic layer 613, having the larger total magnetic moment relatively, is oriented in the same direction (i.e., in the plus Y-axis direction) as the signal magnetic field Hm, as illustrated in FIG. 18B, for example. Thus, the magnetization J611 of the ferromagnetic layer 611, having the smaller total magnetic moment relatively, is oriented in the direction opposite thereto (i.e., in the minus Y-axis direction). Here, since a resistance state in each of the stacked bodies is dependent on a relative angle between the magnetization J611 and the magnetization J631, the stacked bodies 11A and 31A each have a low resistance state and the stacked bodies 21A and 41A each have a high resistance state, when the orientation of the magnetization J631 of the pinned layer 631 is in the plus Y-axis direction. Thus, the magnetic sensor according to this embodiment, provided with the stacked bodies 11A, 21A, 31A, and 41A described above, also functions similarly to the magnetic sensor according to the first embodiment described above.

Consequently, in this embodiment, each of the stacked bodies 11A and 31A in the first and the third MR elements 1 and 3, and each of the stacked bodies 21A and 41A in the second and the fourth MR elements 2 and 4, are configured to exhibit the mutually-different behaviors in response to the signal magnetic field Hm. Therefore, it is possible to achieve effects similar to those of the first embodiment described above. Incidentally, although the magnetization fixed layer 63A has the synthetic structure in this embodiment, the magnetization fixed layer 63A may be formed by a single ferromagnetic material layer or by a plurality of ferromagnetic material layers, in one embodiment.

[Second Modification]

Hereinafter, a modification (a second modification) of the magnetic sensor according to the third embodiment will be described. In the third embodiment described above, all of the magnetization free layers 61A of the stacked bodies 11A, 21A, 31A, and 41A in the first MR elements to the fourth MR elements 1 to 4 have the synthetic structure. However, in the second modification, the magnetization free layers 61A in the first and the third MR elements 1 and 3 each may be configured by a single ferromagnetic material layer or by a plurality of ferromagnetic material layers, instead of the synthetic structure. On the other hand, the magnetization free layers 61A in the second and the fourth MR elements 2 and 4 each have the synthetic structure similar to that of the third embodiment described above. That is, in the magnetization free layer 61A of each of the second and the fourth MR elements 2 and 4, the total magnetic moment of the ferromagnetic layer 613 is made larger than the total magnetic moment of the ferromagnetic layer 611.

Consequently, in this modification having the configuration described above, each of the stacked bodies 11A and 31A in the first and the third MR elements 1 and 3, and each of the stacked bodies 21A and 41A in the second and the fourth MR elements 2 and 4, are configured to exhibit the mutually-different behaviors in response to the signal magnetic field Hm. Therefore, it is possible to achieve effects similar to those of the third embodiment.

It is to be understood that the above description is intended to be illustrative and not restrictive. Many embodiments and modifications will be apparent to those of skill in the art upon reviewing the above description. For example, in the embodiments and the modifications described above, the plurality of stacked bodies are arranged in two lines on the substrate in each of the MR elements. However, the stacked bodies may be arranged in a single line, or may be arranged in 3 lines or more. Also, the stacked bodies may be arranged to depict a certain line, such as a curved line.

Further, in the embodiments and the modifications described above, the description has been given with reference to the tunnel MR element having the tunnel magnetoresistive film as the MR element. However, a current-perpendicular-to-plane (CPP) GMR element having a CPP-GMR film may be employed, for example. In this example, the interposition layer may be replaced by a nonmagnetic material layer having high-electrical conductivity, such as copper (Cu), gold (Au), and so forth, instead of the tunnel barrier layer.

It should be appreciated that variations may be made in the described embodiments by persons skilled in the art without departing from the scope of the invention as defined by the following claims. The limitations in the claims are to be interpreted broadly based on the language employed in the claims and not limited to examples described in the specification or during the prosecution of the application, and the examples are to be construed as non-exclusive. For example, in the disclosure, the term "preferably", "preferred" or the like is non-exclusive and means "preferably", but not limited to. The use of the terms first, second, etc. do not denote any order or importance, but rather the terms first, second, etc. are used to distinguish one element from another. Moreover, no element or component in the disclosure is intended to be dedicated to the public regardless of whether the element or component is explicitly recited in the following claims.

This application is based on and claims priority from Japanese Patent Application No. 2009-175670, filed in the Japan Patent Office on Jul. 28, 2009, the disclosure of which is hereby incorporated by reference in its entirety.

What is claimed is:

1. A magnetoresistive element, comprising:
a plurality of magnetoresistive films each aligned along a lamination plane, and each having an upper surface and a lower surface; and
conductors combining the plurality of magnetoresistive films in series, and including a plurality of top electrodes and a plurality of bottom electrodes, wherein
each one of the top electrodes and corresponding one of the bottom electrodes oppose each other so as to sandwich corresponding one of the magnetoresistive films in a direction of stack of the magnetoresistive films,
each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends, and
the branch section in each of the top electrodes is in contact with an upper surface of the corresponding magnetoresistive film, and the branch section in each of the bottom electrodes is in contact with a lower surface of the corresponding magnetoresistive film.

2. The magnetoresistive element according to claim 1, wherein the stem section of the top electrode is connected to the stem section of the bottom electrode, the branch section of the top electrode is connected to one of the magnetoresistive films, and the branch section of the bottom electrode is connected with another one of the magnetoresistive films adjacent thereto along the series alignment direction.

3. The magnetoresistive element according to claim 1, wherein the extending direction of the branch section of each of the top electrodes and the extending direction of the branch section of each of the bottom electrodes correspond to a direction orthogonal to the series alignment direction of the magnetoresistive films.

4. The magnetoresistive element according to claim 1, wherein the branch sections of the top electrodes and the branch sections of the bottom electrodes each have cross-sectional area equal to one another, the cross-sectional area representing an area of a cross-section orthogonal to the direction in which the branch section extends.

5. The magnetoresistive element according to claim 1, wherein the magnetoresistive films are current-perpendicular-to-plane giant magnetoresistive (CPP-GMR) films.

6. The magnetoresistive element according to claim 1, wherein the magnetoresistive films are tunnel magnetoresistive (TMR) films.

7. A magnetic sensor having first and second magnetoresistive elements each exhibiting a resistance change in an increasing or decreasing direction opposite to each other in response to a signal magnetic field, each of the first and second magnetoresistive elements comprising:
a plurality of magnetoresistive films each aligned along a lamination plane, and each having an upper surface and a lower surface; and
conductors combining the plurality of magnetoresistive films in series, and including a plurality of top electrodes and a plurality of bottom electrodes, wherein
each one of the top electrodes and corresponding one of the bottom electrodes oppose each other so as to sandwich corresponding one of the magnetoresistive films in a direction of stack of the magnetoresistive films,
each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends, and
the branch section in each of the top electrodes is in contact with an upper surface of the corresponding magnetoresistive film, and the branch section in each of the bottom electrodes is in contact with a lower surface of the corresponding magnetoresistive film.

8. The magnetic sensor according to claim 7, further comprising:
- a first constant current source and a second constant current source supplying the first magnetoresistive element and the second magnetoresistive element with constant currents, having values equal to each other, respectively; and
- a difference detector detecting a difference in a voltage drop between the first and second magnetoresistive elements based on the constant current supplied from the first constant current source and the constant current supplied from the second constant current source,
- wherein the magnetic sensor detects the signal magnetic field based on the difference in the voltage drop.

9. A magnetic sensor having first to fourth magnetoresistive elements each exhibiting a resistance change in response to a signal magnetic field, and having a difference detector, each of the first to fourth magnetoresistive elements comprising:
- a plurality of magnetoresistive films each aligned along a lamination plane, and each having an upper surface and a lower surface; and
- conductors combining the plurality of magnetoresistive films in series, and including a plurality of top electrodes and a plurality of bottom electrodes, wherein
- each one of the top electrodes and corresponding one of the bottom electrodes oppose each other so as to sandwich corresponding one of the magnetoresistive films in a direction of stack of the magnetoresistive films,
- each electrode of the top electrodes and the bottom electrodes includes a stem section and a branch section, the stem section extending in a direction along a series alignment direction of the magnetoresistive films, and the branch section extending along the lamination plane in a direction intersecting a direction in which the stem section extends,
- the branch section in each of the top electrodes is in contact with an upper surface of the corresponding magnetoresistive film, and the branch section in each of the bottom electrodes is in contact with a lower surface of the corresponding magnetoresistive film,
- a first end of the first magnetoresistive element and a first end of the second magnetoresistive element are connected together in a first connection point, a first end of the third magnetoresistive element and a first end of the fourth magnetoresistive element are connected together in a second connection point, a second end of the first magnetoresistive element and a second end of the fourth magnetoresistive element are connected together in a third connection point, and a second end of the second magnetoresistive element and a second end of the third magnetoresistive element are connected together in a fourth connection point, to establish a bridge circuit,
- resistances of the first and third magnetoresistive elements change in a same increasing or decreasing direction in response to the signal magnetic field,
- resistances of the second and fourth magnetoresistive elements change in an increasing or decreasing direction opposite to the increasing or decreasing direction of the resistances of the first and third magnetoresistive elements in response to the signal magnetic field, and
- the difference detector detects a difference in potential, which is caused between the third and fourth connection points in response to application of a voltage between the first and second connection points.

* * * * *